(12) United States Patent
Lee

(10) Patent No.: US 10,373,690 B2
(45) Date of Patent: Aug. 6, 2019

(54) MEMORY SYSTEM AND OPERATING METHOD THEREOF

(71) Applicant: SK hynix Inc., Gyeonggi-do (KR)

(72) Inventor: Jong-Min Lee, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 15/927,133

(22) Filed: Mar. 21, 2018

(65) Prior Publication Data

US 2019/0066800 A1 Feb. 28, 2019

(30) Foreign Application Priority Data

Aug. 28, 2017 (KR) ........................ 10-2017-0108687

(51) Int. Cl.
*G11C 11/00* (2006.01)
*G11C 16/16* (2006.01)
*G11C 16/08* (2006.01)
*G06F 12/02* (2006.01)
*G11C 16/30* (2006.01)
*G06F 1/3225* (2019.01)
*G11C 11/4074* (2006.01)

(52) U.S. Cl.
CPC ............ *G11C 16/16* (2013.01); *G06F 1/3225* (2013.01); *G06F 12/0246* (2013.01); *G11C 11/4074* (2013.01); *G11C 16/08* (2013.01); *G11C 16/30* (2013.01); *G06F 2212/7211* (2013.01)

(58) Field of Classification Search
CPC ..... G06F 3/064; G06F 3/0679; G11C 11/005; G11C 16/105; G11C 16/20; G11C 29/52
See application file for complete search history.

(56) References Cited

U.S. PATENT DOCUMENTS

| | | | | |
|---|---|---|---|---|
| 8,917,558 | B2* | 12/2014 | Han | G11C 16/16 365/185.29 |
| 9,779,829 | B2* | 10/2017 | Caillat | G11C 16/3445 |
| 2017/0285950 | A1* | 10/2017 | Lee | G06F 3/064 |
| 2017/0372785 | A1* | 12/2017 | Hahn | G11C 16/3459 |
| 2018/0101454 | A1* | 4/2018 | Lee | G06F 3/0614 |

FOREIGN PATENT DOCUMENTS

KR 1020090032694 4/2009

* cited by examiner

*Primary Examiner* — Hien N Nguyen
(74) *Attorney, Agent, or Firm* — IP & T Group LLP

(57) ABSTRACT

A memory system includes: a nonvolatile memory device including a plurality of memory blocks; and a controller suitable for dividing the plurality of memory blocks into a first group and a second group, and controlling the memory blocks included the first group and the second group, respectively, wherein the controller is further suitable for: managing all operations except for an erase operation to the memory blocks of the first group through a first operation task; managing all operations except for an erase operation to the memory blocks of the second group through a second operation task; and managing the erase operation to the memory blocks of the first group and the memory blocks of the second group through an erase operation task.

20 Claims, 12 Drawing Sheets

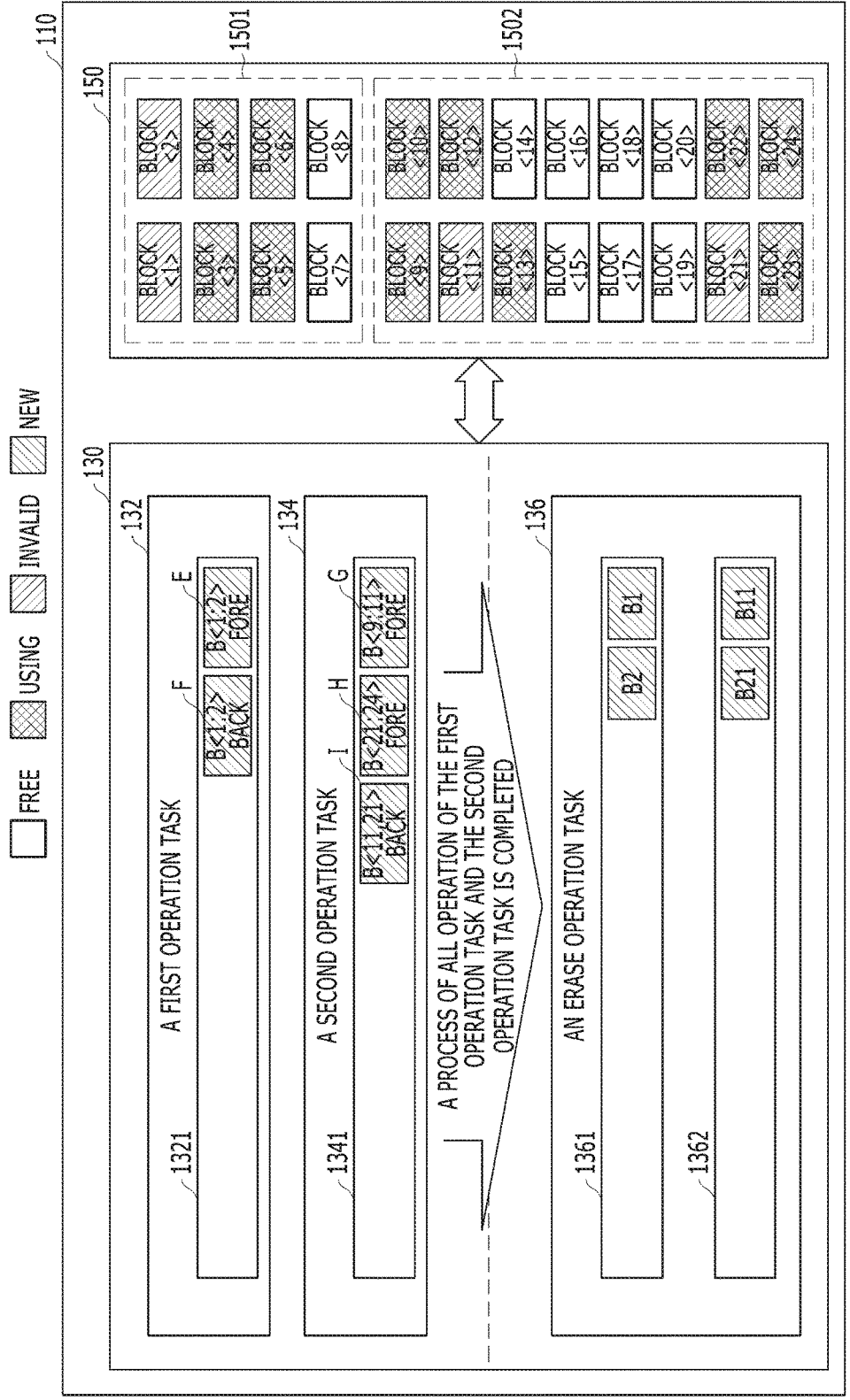

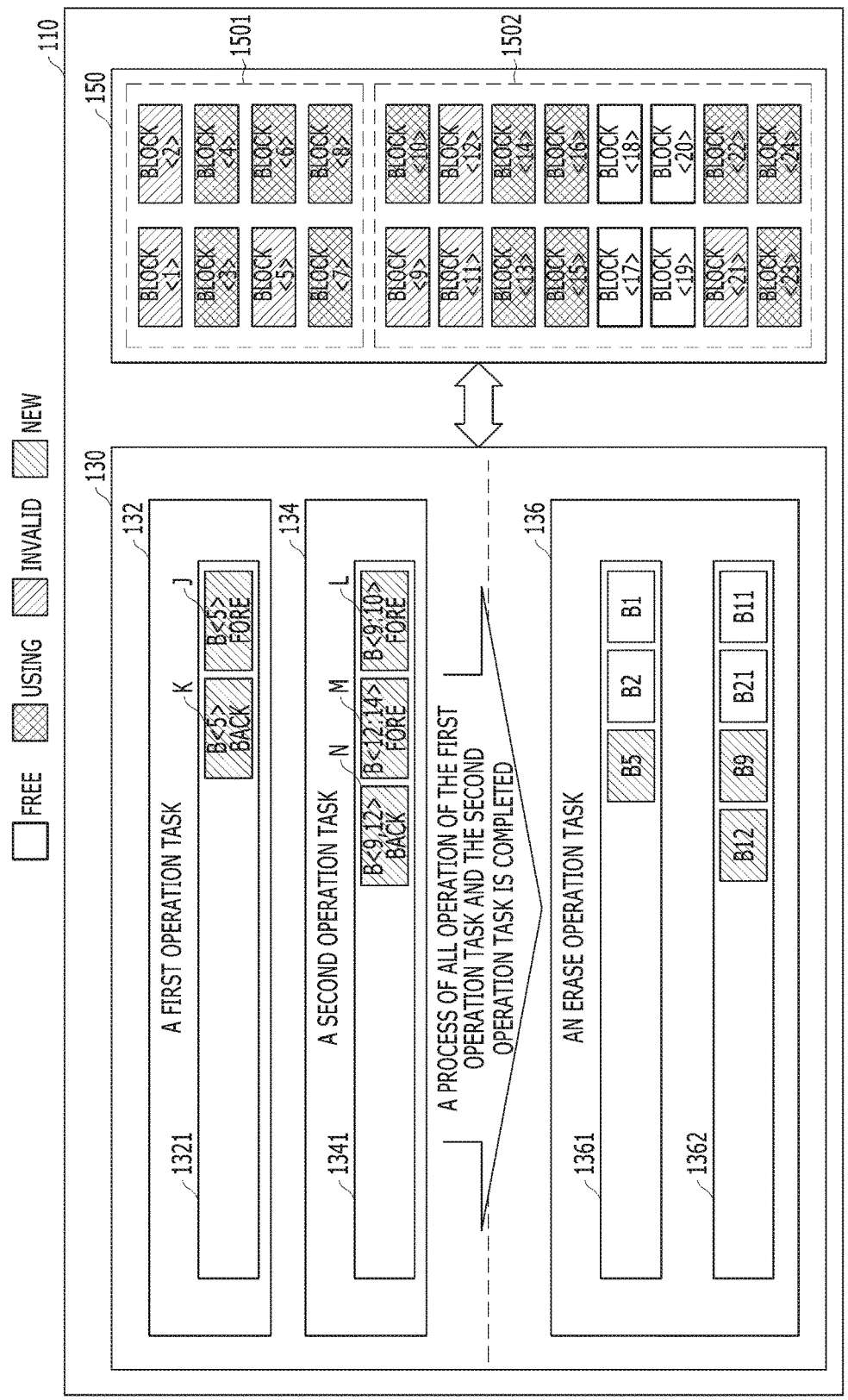

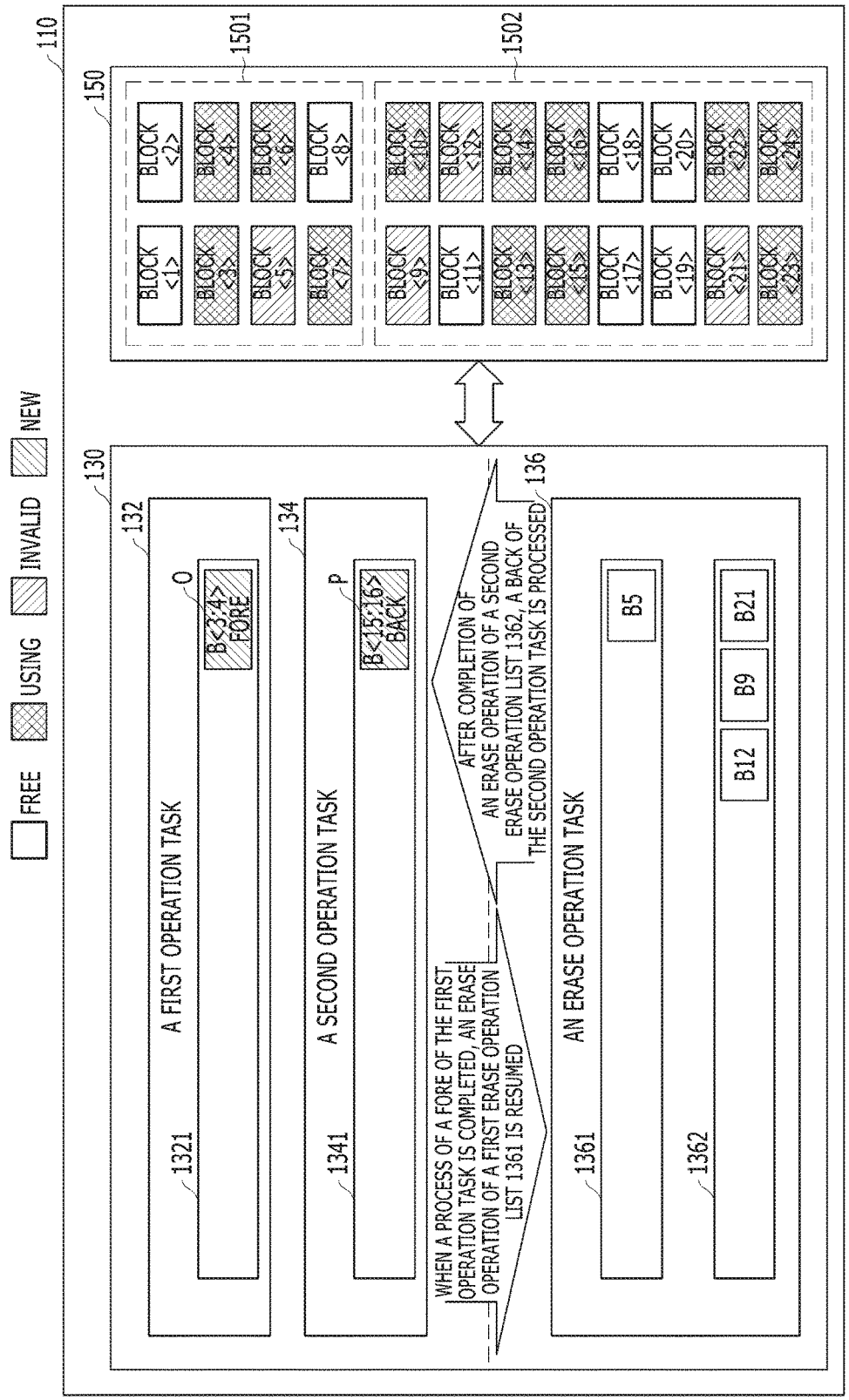

MEMORY SYSTEM AND OPERATING METHOD THEREOF

CROSS-REFERENCE TO RELATED APPLICATIONS

The present application claims priority under 35 U.S.C. § 119(a) to Korean Patent Application No. 10-2017-0108687 filed on Aug. 28, 2017, the disclosure of which is incorporated herein by reference in its entirety.

BACKGROUND

1. Field

Various exemplary embodiments of the present invention relate to a memory system. Particularly, exemplary embodiments relate to a memory system capable of efficiently performing an erase operation, and an operating method thereof.

2. Description of the Related Art

The paradigm for computing environments is shifting toward ubiquitous computing which allows users to use computer systems anytime and anywhere. For this reason, the demand for portable electronic devices, such as mobile phones, digital cameras and laptop computers are soaring. Those electronic devices generally include a memory system using a memory device as a data storage device. The data storage device may be used as a main memory unit or an auxiliary memory unit of a portable electronic device.

Since the data storage device using a memory device does not have a mechanical driving unit, it may have excellent stability and durability. Also, the data storage device has a quick data access rate with low power consumption. Non-limiting examples of the data storage device having such advantages include Universal Serial Bus (USB) memory devices, memory cards of diverse interfaces, Solid-State Drives (SSD) and the like.

SUMMARY

Various embodiments of the present invention are directed to a memory system capable of efficiently performing an erase operation, and an operating method thereof.

In accordance with an embodiment of the present invention, a memory system includes a nonvolatile memory device including a plurality of memory blocks; and a controller suitable for dividing the plurality of memory blocks into a first group and a second group, and controlling the memory blocks included the first group and the second group, respectively, wherein the controller is further suitable for: managing all operations except for an erase operation to the memory blocks of the first group through a first operation task; managing all operations except for an erase operation to the memory blocks of the second group through a second operation task; and managing the erase operation to the memory blocks of the first group and the memory blocks of the second group through an erase operation task.

The controller may be suitable for, when there is need to perform an erase operation to a first memory block among the memory blocks of the first group as a result of a first predetermined operation through the first operation task, providing information of the first memory block into a first erase operation list managed by the erase operation task and performing an erase operation to memory blocks included in the first erase operation list through the erase operation task when a first predetermined condition is satisfied.

The controller may be suitable for performing an erase operation to a first portion of memory block selected among the memory blocks included in the first erase operation list through the erase operation task by determining that the first predetermined condition is satisfied when a ratio of memory blocks in a free status to memory blocks in a "being used" status among the memory blocks of the first group is below a first predetermined threshold ratio, or when a number of memory blocks in the free status is below a first predetermined threshold number.

The controller may be suitable for controlling a number of memory blocks selected as the first portion of memory blocks among the memory blocks included in the first erase operation list according to a ratio of a number of memory blocks included in the first erase operation list to a number of memory blocks in the free status among the memory blocks of the first group.

In case that there is need to perform an erase operation to a second memory block among the memory blocks of the second group as a result of a second predetermined operation through the second operation task, the controller may be suitable for including information of the second memory block into a second erase operation list managed by the erase operation task and performing an erase operation to memory blocks included in the second erase operation list through the erase operation task when a second predetermined condition is satisfied.

The controller may be suitable for performing an erase operation to a second portion of memory block selected among the memory blocks included in the second erase operation list through the erase operation task by determining the second predetermined condition as satisfied when a ratio of memory blocks in a free status to memory blocks in a "being used" status among the memory blocks of the second group is below a second predetermined threshold ratio, or when a number of memory blocks in the free status is below a second predetermined threshold number.

The controller may be suitable for controlling a number of memory blocks selected as the second portion of memory blocks among the memory blocks included in the second erase operation list according to a ratio of a number of memory blocks included in the second erase operation list to a number of memory blocks in the free status among the memory blocks of the second group.

In case that a foreground operation is requested among all operation except for an erase operation managed through the first or second operation task during an erase operation to memory blocks included in the first or second erase operation list through the erase operation task, the controller may be suitable for suspending the erase operation to memory blocks included in the first or second erase operation list through the erase operation task, performing the requested foreground operation through the first or second operation task, and then resuming the suspended erase operation to memory blocks included in the first or second erase operation list through the erase operation task.

The controller may be suitable for setting a higher priority to an erase operation to the memory blocks included in the first or second erase operation list managed through the erase operation task than a background operation among all operations except for an erase operation managed through the first or second operation task.

The controller may be suitable for checking whether the first predetermined condition is satisfied whenever all operations except for an erase operation managed by the first operation task is performed N times and checking whether the second predetermined condition is satisfied whenever all operations except for an erase operation managed by the second operation task is performed M times, and each of N and M may be a natural number greater than 1.

In accordance with an embodiment of the present invention, an operating method of a memory system including a nonvolatile memory device having a plurality of memory blocks, the method may include a first step of controlling memory blocks included in a first group among the plurality of memory blocks and a second step of controlling memory blocks included in a second group among the plurality of memory blocks, and the first step may include managing all operations except for an erase operation to the memory blocks of the first group through a first operation task, and managing the erase operation to the memory blocks of the first group through an erase operation task, and the second step may include managing all operations except for an erase operation to the memory blocks of the second group through a second operation task, and managing the erase operation to the memory blocks of the second group through the erase operation task.

In case that there is need to perform an erase operation to a first memory block among the memory blocks of the first group as a result of a first predetermined operation through the first operation task, the first step may include providing information of the first memory block into a first erase operation list managed by the erase operation task and performing an erase operation to memory blocks included in the first erase operation list through the erase operation task when a first predetermined condition is satisfied.

The first step may include performing an erase operation to a first portion of memory block selected among the memory blocks included in the first erase operation list through the erase operation task by determining that the first predetermined condition is satisfied when a ratio of memory blocks in a free status to memory blocks in a "being used" status among the memory blocks of the first group is below a first predetermined threshold ratio, or when a number of memory blocks in the free status is below a first predetermined threshold number.

The first step may include controlling a number of memory blocks selected as the first portion of memory blocks among the memory blocks included in the first erase operation list according to a ratio of a number of memory blocks included in the first erase operation list to a number of memory blocks in the free status among the memory blocks of the first group.

In case that there is need to perform an erase operation to a second memory block among the memory blocks of the second group as a result of a second predetermined operation through the second operation task, the second step may include including information of the second memory block into a second erase operation list managed by the erase operation task and performing an erase operation to memory blocks included in the second erase operation list through the erase operation task when a second predetermined condition is satisfied.

The second step may include performing an erase operation to a second portion of a memory block selected among the memory blocks included in the second erase operation list through the erase operation task by determining that the second predetermined condition is satisfied when a ratio of memory blocks in a free status to memory blocks in a "being used" status among the memory blocks of the second group is below a second predetermined threshold ratio, or when a number of memory blocks in the free status is below a second predetermined threshold number.

The second step may include controlling a number of memory blocks selected as the second portion of memory blocks among the memory blocks included in the second erase operation list according to a ratio of a number of memory blocks included in the second erase operation list to a number of memory blocks in the free status among the memory blocks of the second group.

The first step may include, when a foreground operation is requested among all operations except for an erase operation managed through the first operation task during an erase operation to memory blocks included in the first erase operation list through the erase operation task, suspending the erase operation to memory blocks included in the first erase operation list through the erase operation task, performing the requested foreground operation through the first operation task, and then resuming the suspended erase operation to memory blocks included in the first erase operation list through the erase operation task, and the second step may include, when a foreground operation is requested among all operations except for an erase operation managed through the second operation task during an erase operation to memory blocks included in the second erase operation list through the erase operation task, suspending the erase operation to memory blocks included in the second erase operation list through the erase operation task, performing the requested foreground operation through the second operation task, and then resuming the suspended erase operation to memory blocks included in the second erase operation list through the erase operation task.

The first step may include setting a higher priority to an erase operation to the memory blocks included in the first erase operation list managed through the erase operation task than a background operation among all operations except for an erase operation managed through the first operation task, and the second step may include setting a higher priority to an erase operation to the memory blocks included in the second erase operation list managed through the erase operation task than a background operation among all operations except for an erase operation managed through the second operation task.

The first step may include checking whether the first predetermined condition is satisfied whenever all operations except for an erase operation managed by the first operation task is performed N times, and the second step may include checking whether the second predetermined condition is satisfied whenever all operations except for an erase operation managed by the second operation task is performed M times, and each of N and M is a natural number greater than 1.

BRIEF DESCRIPTION OF THE DRAWINGS

FIGS. 5a to 5d are diagrams illustrating an operation of the memory system of FIG. 1.

DETAILED DESCRIPTION

Figure 1:
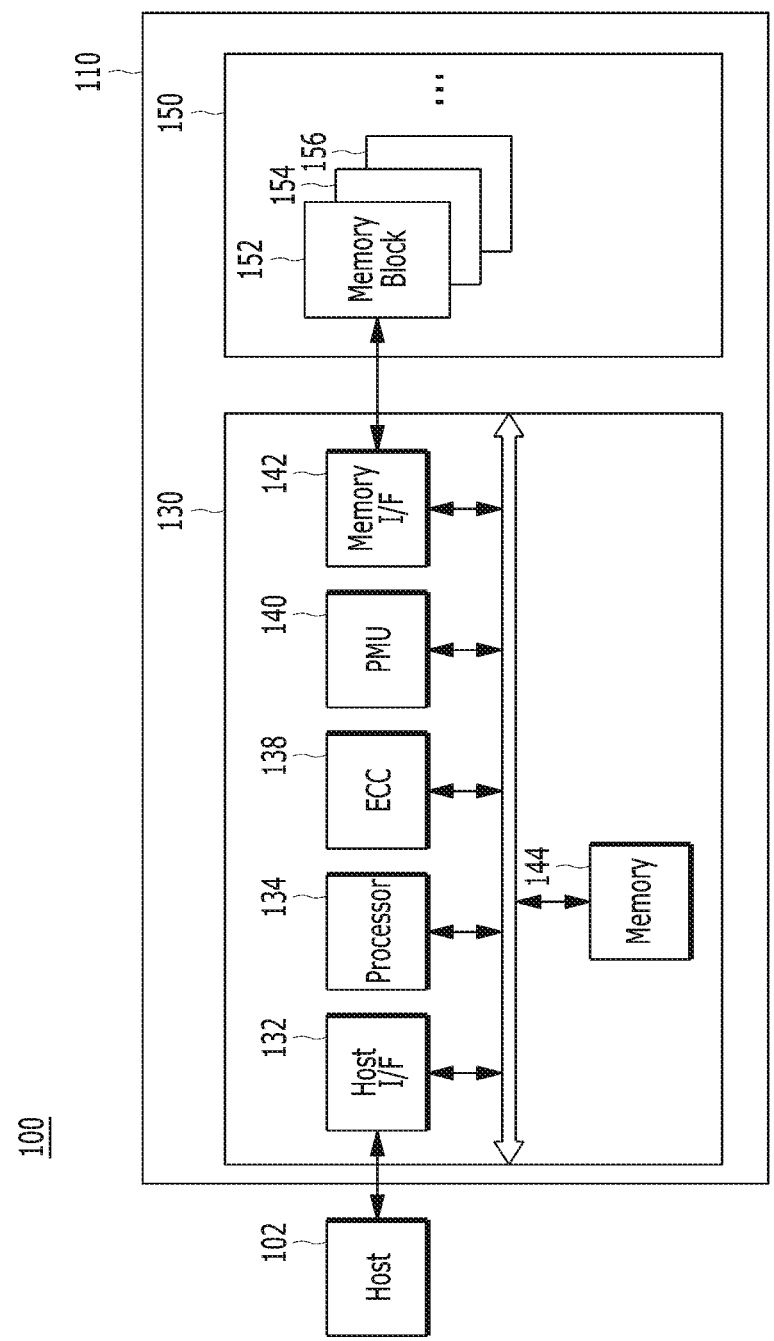
FIG. 1 is a block diagram illustrating a data processing system including a memory system, in accordance with an embodiment of the present invention.

Various embodiments of the present invention are described below in more detail with reference to the accompanying drawings. We note, however, that the present invention may be embodied in different other embodiments, forms and variations thereof and should not be construed as being limited to the embodiments set forth herein. Rather, the described embodiments are provided so that this disclosure will be thorough and complete, and will fully convey the present invention to those skilled in the art to which this invention pertains. Throughout the disclosure, like reference numerals refer to like parts throughout the various figures and embodiments of the present invention.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

The drawings are not necessarily to scale and, in some instances, proportions may have been exaggerated in order to clearly illustrate features of the embodiments. When an element is referred to as being connected or coupled to another element, it should be understood that the former can be directly connected or coupled to the latter, or electrically connected or coupled to the latter via an intervening element therebetween.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

The terminology used herein is for the purpose of describing particular embodiments only and is not intended to be limiting of the present invention.

As used herein, singular forms are intended to include the plural forms as well, unless the context clearly indicates otherwise.

It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the present invention belongs in view of the present disclosure. It will be further understood that terms, such as those defined in commonly used dictionaries, should be interpreted as having a meaning that is consistent with their meaning in the context of the present disclosure and the relevant art and will not be interpreted in an idealized or overly formal sense unless expressly so defined herein.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, a feature or element described in connection with one embodiment may be used singly or in combination with other features or elements of another embodiment, unless otherwise specifically indicated.

FIG. 1 is a block diagram illustrating a data processing system 100 in accordance with an embodiment of the present invention.

Referring to FIG. 1, the data processing system 100 may include a host 102 operatively coupled to a memory system 110.

The host 102 may include, for example, a portable electronic device such as a mobile phone, an MP3 player and a laptop computer or an electronic device such as a desktop computer, a game player, a TV, a projector and the like.

The memory system 110 may operate in response to a request from the host 102, and in particular, store data to be accessed by the host 102. The memory system 110 may be used as a main memory system or an auxiliary memory system of the host 102. The memory system 110 may be implemented with any one of various types of storage devices, which may be electrically coupled with the host 102, according to a protocol of a host interface. Examples of suitable storage devices include a solid state drive (SSD), a multimedia card (MMC), an embedded MMC (eMMC), a reduced size MMC (RS-MMC) and a micro-MMC, a secure digital (SD) card, a mini-SD and a micro-SD, a universal serial bus (USB) storage device, a universal flash storage (UFS) device, a compact flash (CF) card, a smart media (SM) card, a memory stick, and the like.

The storage devices for the memory system 110 may be implemented with a volatile memory device such as a dynamic random access memory (DRAM) and a static RAM (SRAM) and nonvolatile memory device such as a read only memory (ROM), a mask ROM (MROM), a programmable ROM (PROM), an erasable programmable ROM (EPROM), an electrically erasable programmable ROM (EEPROM), a ferroelectric RAM (FRAM), a phase-change RAM (PRAM), a magneto-resistive RAM (MRAM), resistive RAM (RRAM) and a flash memory.

The memory system 110 may include a memory device 150 which stores data to be accessed by the host 102, and a controller 130 which may control storage of data in the memory device 150.

The controller 130 and the memory device 150 may be integrated into a single semiconductor device, which may be included in the various types of memory systems as exemplified above.

The memory system 110 may be configured as part of a computer, an ultra-mobile PC (UMPC), a workstation, a net-book, a personal digital assistant (PDA), a portable computer, a web tablet, a tablet computer, a wireless phone, a mobile phone, a smart phone, an e-book, a portable multimedia player (PMP), a portable game player, a navigation system, a black box, a digital camera, a digital multimedia broadcasting (DMB) player, a 3D television, a smart television, a digital audio recorder, a digital audio player, a digital picture recorder, a digital picture player, a digital video recorder, a digital video player, a storage configuring a data center, a device capable of transmitting and receiving information under a wireless environment, one of various electronic devices configuring a home network, one of various electronic devices configuring a computer network, one of various electronic devices configuring a telematics network, a radio frequency identification (RFID) device, or one of various component elements configuring a computing system.

The memory device 150 may be a nonvolatile memory device and may retain data stored therein even though power is not supplied. The memory device 150 may store data provided from the host 102 through a write operation, and provide data stored therein to the host 102 through a read operation. The memory device 150 may include a plurality of memory blocks 152 to 156, each of the memory blocks 152 to 156 may include a plurality of pages. Each of the pages may include a plurality of memory cells to which a plurality of word lines (WL) are electrically coupled.

The controller 130 may control overall operations of the memory device 150, such as read, write, program and erase operations. For example, the controller 130 of the memory system 110 may control the memory device 150 in response to a request from the host 102. The controller 130 may provide the data read from the memory device 150, to the host 102, and/or may store the data provided from the host 102 into the memory device 150.

The controller 130 may include a host interface (I/F) unit 132, a processor 134, an error correction code (ECC) unit 138, a power management unit (PMU) 140, a memory device controller such as a memory interface (I/F) unit 142 and a memory 144 all operatively coupled via an internal bus.

The host interface unit 132 may process commands and data provided from the host 102, and may communicate with the host 102 through at least one of various interface protocols such as universal serial bus (USB), multimedia card (MMC), peripheral component interconnect-express (PCI-E), small computer system interface (SCSI), serial-attached SCSI (SAS), serial advanced technology attachment (SATA), parallel advanced technology attachment (PATA), small computer system interface (SCSI), enhanced small disk interface (ESDI) and integrated drive electronics (IDE).

The ECC unit 138 may detect and correct errors in the data read from the memory device 150 during the read operation. The ECC unit 138 may not correct error bits when the number of the error bits is greater than or equal to a threshold number of correctable error bits, and may output an error correction fail signal indicating failure in correcting the error bits.

The ECC unit 138 may perform an error correction operation based on a coded modulation such as a low density parity check (LDPC) code, a Bose-Chaudhuri-Hocquenghem (BCH) code, a turbo code, a Reed-Solomon (RS) code, a convolution code, a recursive systematic code (RSC), a trellis-coded modulation (TCM), a Block coded modulation (BCM), and so on. The ECC unit 138 may include all circuits, modules, systems or devices for the error correction operation.

The PMU 140 may provide and manage power of the controller 130.

The memory interface 142 may serve as a memory/storage interface between the controller 130 and the memory device 150 to allow the controller 130 to control the memory device 150 in response to a request from the host 102. The memory interface 142 may generate a control signal for the memory device 150 and process data to be provided to the memory device 150 under the control of the processor 134 when the memory device 150 is a flash memory and, in particular, when the memory device 150 is a NAND flash memory.

The memory 144 may serve as a working memory of the memory system 110 and the controller 130, and store data for driving the memory system 110 and the controller 130. The controller 130 may control the memory device 150 in response to a request from the host 102. The controller 130 may provide data read from the memory device 150 to the host 102, may store data provided from the host 102 into the memory device 150. The memory 144 may store data required for the controller 130 and the memory device 150 to perform these operations.

The memory 144 may be implemented with a volatile memory. The memory 144 may be implemented with a static random access memory (SRAM) or a dynamic random access memory (DRAM). Although FIG. 1 exemplifies the memory 144 disposed within the controller 130, the present disclosure is not limited thereto. That is, the memory 144 may be disposed within or out of the controller 130. For instance, in an embodiment, the memory 144 may be embodied by an external volatile memory having a memory interface transferring data between the memory 144 and the controller 130.

The processor 134 may control the overall operations of the memory system 110. The processor 134 may drive firmware to control the overall operations of the memory system 110. The firmware may be referred to as flash translation layer (FTL).

A FTL may perform an operation as an interface between the host 102 and the memory device 150. The host 102 may request the memory device 150 to perform write and read operations through the FTL.

The FTL may manage operations of address mapping, garbage collection, wear-leveling and so forth. Particularly, the FTL may store map data. Therefore, the controller 130 may map a logical address, which is provided from the host 102, to a physical address of the memory device 150 through the map data. The memory device 150 may perform an operation like a general device because of the address mapping operation. Also, through the address mapping operation based on the map data, when the controller 130 updates data of a particular page, the controller 130 may program new data into another empty page and may invalidate old data of the particular page due to a characteristic of a flash memory device. Further, the controller 130 may store map data of the new data into the FTL.

The processor 134 may be implemented with a microprocessor or a central processing unit (CPU). The memory system 110 may include one or more processors 134.

A management unit (not shown) may be included in the processor 134, and may perform bad block management of the memory device 150. The management unit may find bad memory blocks included in the memory device 150, which are in unsatisfactory condition for further use, and perform bad block management on the bad memory blocks. When the memory device 150 is a flash memory, for example, a NAND flash memory, a program failure may occur during the write operation, for example, during the program operation, due to characteristics of a NAND logic function. During the bad block management, the data of the program-failed memory block or the bad memory block may be programmed into a new memory block. Also, the bad blocks seriously deteriorate the utilization efficiency of the memory device 150 having a 3D stack structure and the reliability of the memory system 100, and thus reliable bad block management is required.

Figure 2:
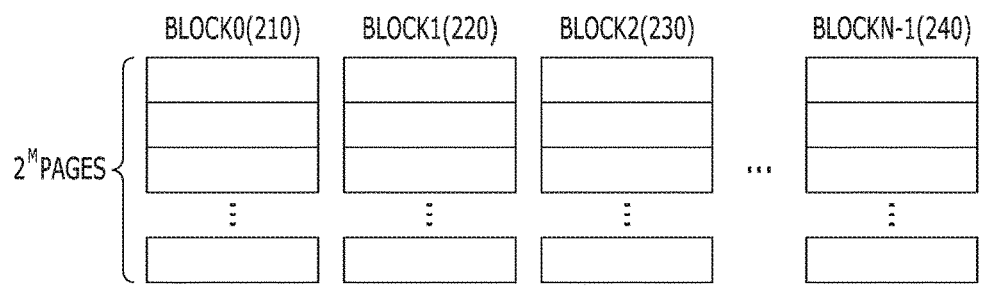
FIG. 2 is a schematic diagram illustrating an exemplary configuration of a memory device of the memory system shown in FIG. 1.

FIG. 2 is a schematic diagram illustrating the memory device 150.

Referring to FIG. 2, the memory device 150 may include the plurality of memory blocks BLOCK 0 to BLOCKN−1, and each of the blocks BLOCK 0 to BLOCKN−1 may include a plurality of pages, for example, $2^M$ pages, the number of which may vary according to circuit design. The memory device 150 may include a plurality of memory blocks, such as single level cell (SLC) memory blocks and multi-level cell (MLC) memory blocks, according to the number of bits which may be stored or expressed in each memory cell. The SLC memory block may include a plurality of pages which are implemented with memory cells each capable of storing 1-bit data. The MLC memory block may include a plurality of pages which are implemented with memory cells each capable of storing multi-bit data, for example, two or more-bit data. An MLC memory block including a plurality of pages which are implemented with memory cells that are each capable of storing 3-bit data may be defined as a triple level cell (TLC) memory block.

Figure 3:
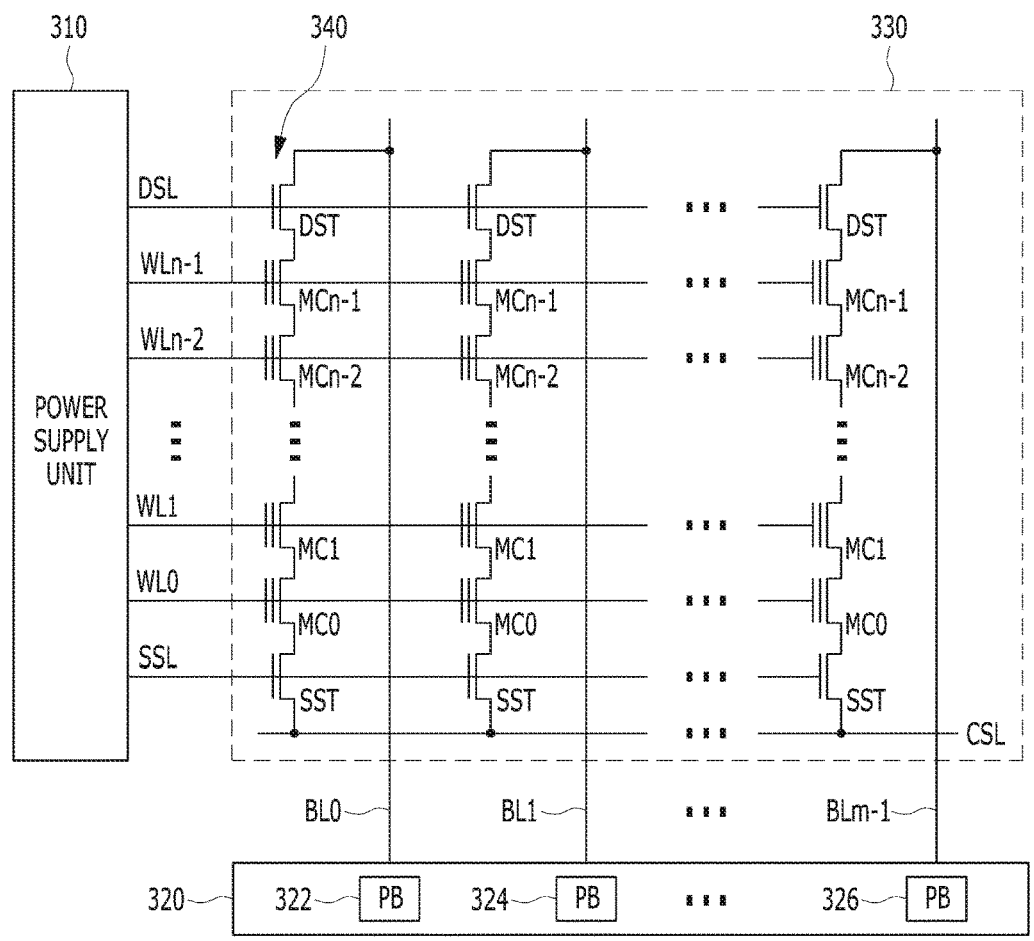
FIG. 3 is a circuit diagram illustrating an exemplary configuration of a memory cell array of a memory block in the memory device shown in FIG. 2.

FIG. 3 is a circuit diagram illustrating a memory block 330 in the memory device 150.

Referring to FIG. 3, the memory block 330 corresponds to any of the plurality of memory blocks 152 to 156.

Referring to FIG. 3, the memory block 152 of the memory device 150 may include a plurality of cell strings 340 which are electrically coupled to bit lines BL0 to BLm−1, respectively. The cell string 340 of each column may include at least one drain select transistor DST and at least one source select transistor SST. A plurality of memory cells or a plurality of memory cell transistors MC0 to MCn-1 may be electrically coupled in series between the select transistors DST and SST. The respective memory cells MC0 to MCn-1 may be configured by single level cells (SLC) each of which may store 1 bit of information, or by multi-level cells (MLC) each of which may store data information of a plurality of bits. The strings 340 may be electrically coupled to the corresponding bit lines BL0 to BLm-1, respectively. For reference, in FIG. 3, 'DSL' denotes a drain select line, 'SSL' denotes a source select line, and 'CSL' denotes a common source line.

While FIG. 3 only shows, as an example, the memory block 152 which is configured by NAND flash memory cells, it is to be noted that the memory block 152 of the memory device 150 according to the embodiment is not limited to NAND flash memory and may be realized by NOR flash memory, hybrid flash memory in which at least two kinds of memory cells are combined, or one-NAND flash memory in which a controller is built in a memory chip. The operational characteristics of a semiconductor device may be applied to not only a flash memory device in which a charge storing layer is configured by conductive floating gates but also a charge trap flash (CTF) in which a charge storing layer is configured by a dielectric layer.

A power supply unit 310 of the memory device 150 may provide word line voltages, for example, a program voltage, a read voltage and a pass voltage, to be supplied to respective word lines according to an operation mode and voltages to be supplied to bulks, for example, well regions in which the memory cells are formed. The power supply unit 310 may perform a voltage generating operation under the control of a control circuit (not shown). The power supply unit 310 may generate a plurality of variable read voltages to generate a plurality of read data, select one of the memory blocks or sectors of a memory cell array under the control of the control circuit, select one of the word lines of the selected memory block, and provide the word line voltages to the selected word line and unselected word lines.

A read/write circuit 320 of the memory device 150 may be controlled by the control circuit, and may serve as a sense amplifier or a write driver according to an operation mode. During a verification/normal read operation, the read/write circuit 320 may operate as a sense amplifier for reading data from the memory cell array. During a program operation, the read/write circuit 320 may operate as a write driver for driving bit lines according to data to be stored in the memory cell array. During a program operation, the read/write circuit 320 may receive from a buffer (not illustrated) data to be stored into the memory cell array, and drive bit lines according to the received data. The read/write circuit 320 may include a plurality of page buffers 322 to 326 respectively corresponding to columns (or bit lines) or column pairs (or bit line pairs), and each of the page buffers 322 to 326 may include a plurality of latches (not illustrated).

Figure 4:
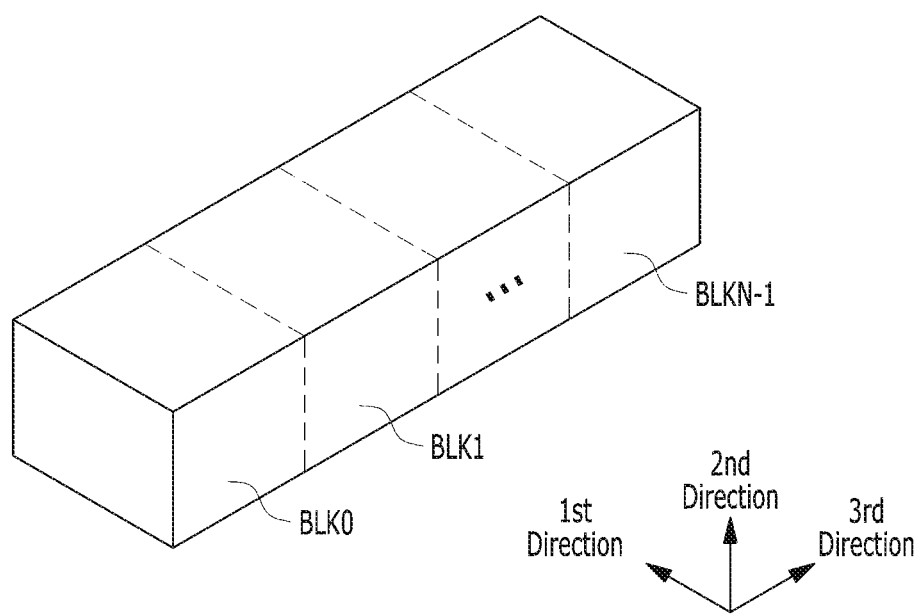
FIG. 4 is a schematic diagram illustrating an exemplary three-dimensional structure of the memory device shown in FIG. 2.

FIG. 4 is a schematic diagram illustrating a 3D structure of the memory device 150.

The memory device 150 may be embodied by a 2D or 3D memory device. Specifically, as illustrated in FIG. 4, the memory device 150 may be embodied by a nonvolatile memory device having a 3D stack structure. When the memory device 150 has a 3D structure, the memory device 150 may include a plurality of memory blocks BLK0 to BLKN−1 each having a 3D structure (or vertical structure).

FIGS. 5A to 5D are diagrams illustrating an operation of a memory system in accordance with an embodiment of the present invention.

Referring to FIGS. 5A to 5D, it may be seen that the memory system 110 includes the nonvolatile memory device 150 with reference to the memory system 110 described with reference to FIG. 1.

Here, the nonvolatile memory device 150 may include the plurality of memory blocks BLOCK<1:24>, as described with reference to FIG. 1.

For reference, FIGS. 5A to 5D illustrate the memory system 110 including a single nonvolatile memory device 150, which is just an example for the convenience of the description, and more nonvolatile memory devices may be included in the memory system 110. For reference, FIGS. 5A to 5D illustrate the nonvolatile memory device 150 including the 24 memory blocks BLOCK<1:24>, which is just an example for the convenience of the description, and more or less memory blocks may be included in the nonvolatile memory device 150.

Further, FIGS. 5A to 5D do not illustrate just for the convenience of the description the host interface 132, the processor 134, the ECC unit 138, the power management unit 140, the NAND flash controller 142 and the memory 144 included in the controller 130 as described with reference to FIG. 1. However, these elements may be included in the controller 130.

Particularly, in accordance with an embodiment of the present invention, the memory system 110 may include the nonvolatile memory device 150 having the plurality of memory blocks BLOCK<1:24>, and the controller 130 configured to divide the plurality of memory blocks BLOCK<1:24> into a first group 1501 of the memory blocks BLOCK<1:8> for a first purpose and a second group 1502 of the memory blocks BLOCK<9:24> for a second purpose and control the first and second groups 1501 and 1502.

Here, the controller 130 may control all operations except for an erase operation to the first group 1501 of the memory blocks BLOCK<1:8> through a first operation task 132. Further, the controller 130 may control all operations except for an erase operation to the second group 1502 of the memory blocks BLOCK<9:24> through a second operation task 134. Still further, the controller 130 may control the erase operation to the plurality of memory blocks BLOCK<1:24> through an erase operation task 136.

At this time, each purpose of the plurality of memory blocks BLOCK<1:24> included in the nonvolatile memory device 150 may be set by the controller 130. Therefore, FIGS. 5A to 5D exemplify the first group 1501 of the memory blocks BLOCK<1:8> and the second group 1502 of the memory blocks BLOCK<9:24> divided from the plurality of memory blocks BLOCK<1:24> and controlled by the controller 130.

Further, a number of memory blocks included in the first group 1501 and a number of memory blocks included in the second group 1502 may be set and adjusted by the controller 130. Therefore, FIGS. 5A to 5D exemplify the first group 1501 of the 8 memory blocks BLOCK<1:8> and the second group 1502 of the 16 memory blocks BLOCK<9:24> divided from the plurality of memory blocks BLOCK<1:24> and controlled by the controller 130.

The purpose of the first group 1501 of the memory blocks BLOCK<1:8> is to store data, reliability of which should be secured, such as map data. For this end, each memory cell (not illustrated) included in the first group 1501 of the memory blocks BLOCK<1:8> may operate as a SLC. The purpose of the second group 1502 of the memory blocks BLOCK<9:24> is to store a larger amount of data, such as user data. For this end, each memory cell (not illustrated) included in the second group 1502 of the memory blocks BLOCK<9:24> may operate as a TLC.

For reference, FIGS. 5A to 5D exemplify the first group 1501 of the memory blocks BLOCK<1:8> and the second group 1502 of the memory blocks BLOCK<9:24> according to their purposes, which is just an example. The plurality of memory blocks BLOCK<1:24> may be divided into greater number of groups of the memory blocks according to their purposes. The purposes of the memory blocks may vary according to the system designer. For example, the plurality of memory blocks BLOCK<1:24> may be divided according to the purposes of data reliability, storage capacity, memory cell durability, and so forth.

As described above, the controller 130 may divide the plurality of memory blocks BLOCK<1:24> included in the nonvolatile memory device 150 into the first group 1501 of the memory blocks BLOCK<1:8> and the second group 1502 of the memory blocks BLOCK<9:24>, and may control the first and second groups 1501 and 1502.

Here, the controller 130 may control all operations except for an erase operation to the first group 1501 of the memory blocks BLOCK<1:8> through the first operation task 132, and may control the erase operation to the first group 1501 of the memory blocks BLOCK<1:8> through the erase operation task 136.

Further, the controller 130 may control all operations except for an erase operation to the second group 1502 of the memory blocks BLOCK<9:24> through the second operation task 134, and may control the erase operation to the second group 1502 of the memory blocks BLOCK<9:24> through the erase operation task 136.

As described above, the controller 130 may control all operations except for the erase operation through the operation tasks for the groups of the memory blocks. The controller 130 may generate the first operation task 132 for all operations except for the erase operation to the first group 1501 of the memory blocks BLOCK<1:8>, and may generate the second operation task 134 for all operations except for the erase operation to the second group 1502 of the memory blocks BLOCK<9:24>. All operations except for the erase operation may mean remaining general operations that can be performed to the nonvolatile memory device 150 except for the erase operation. For example, all operations except for the erase operation may include read and write (i.e., program) operations as foreground operations performed to the nonvolatile memory device 150 in response to request from the host 102. For example, all operations except for the erase operation may include a copy operation and a move operation of a garbage collection operation, wear leveling operation, a map update operation and so forth as background operations performed to the nonvolatile memory device 150 according to internal decisions.

For reference, when the nonvolatile memory device 150 includes a greater number of the groups of the memory blocks, for example, when the nonvolatile memory device 150 includes 3 groups of the memory blocks (not illustrated) according to the purposes of the memory blocks, the controller 130 may generate and manage 3 operation tasks.

Also, the controller 130 may generate the erase operation task 136 for managing an erase operation to the plurality of memory blocks BLOCK<1:24> no matter how many groups of the memory blocks are divided from the plurality of memory blocks BLOCK<1:24> included in the nonvolatile memory device 150. That is, all erase operations to the first group 1501 of the memory blocks BLOCK<1:8> and the second group 1502 of the memory blocks BLOCK<9:24> (i.e., all of the memory blocks included in the plurality of memory blocks BLOCK<1:24>) may be managed by the single erase operation task 136.

As described above, the controller 130 may generate and manage the first operation task 132, the second operation task 134 and the erase operation task 136.

Here, the first operation task 132 may include a first operation list 1321 configured to store information of operations to be performed to the first group 1501 of the memory blocks BLOCK<1:8> in a form of a queue. The operation, information of which is to be stored in the first operation list 1321, may be all operations except for the erase operation to the first group 1501 of the memory blocks BLOCK<1:8> since the first operation task 132 may manage all operations except for the erase operation to the first group 1501 of the memory blocks BLOCK<1:8>. Each information of the operation to be stored in the first operation list 1321 may include address information for one or more of the memory blocks BLOCK<1:8> included in the first group 1501 and command information indicating corresponding operations among all operations except for the erase operation to be performed to corresponding memory block.

Further, the second operation task 134 may include a second operation list 1341 configured to store information of operations to be performed to the second group 1502 of the memory blocks BLOCK<9:24> in a form of a queue. The operations, information of which is to be stored in the second operation list 1341, may be all operations except for the erase operation to the second group 1502 of the memory blocks BLOCK<9:24> since the second operation task 134 may manage all operations except for the erase operation to the second group 1502 of the memory blocks BLOCK<9:24>. Each information of the operations to be stored in the second operation list 1341 may include address information for one or more of the memory blocks BLOCK<9:24> included in the second group 1502 and command information indicating corresponding operations among all operations except for the erase operation to be performed to corresponding memory block.

Also, the erase operation task 136 may include a first erase operation list 1361 configured to store information of one or more memory blocks, to which an erase operation is to be performed among the memory blocks BLOCK<1:8> of the first group 1501, in a form of a queue, and a second erase operation list 1362 configured to store information of one or more memory blocks, to which an erase operation is to be performed among the memory blocks BLOCK<9:24> of the second group 1502, in a form of a queue.

Each information of the operation to be stored in the first erase operation list 1361 may include address information for one or more memory blocks, to which an erase operation is to be performed among the memory blocks BLOCK<1:8> of the first group 1501, and each information of the operation to be stored in the second erase operation list 1362 may include address information for one or more memory blocks, to which an erase operation is to be performed among the memory blocks BLOCK<9:24> of the second group 1502, since the erase operation task 136 may manage the erase operation to first group 1501 of the memory blocks BLOCK<1:8> and the second group 1502 of the memory blocks BLOCK<9:24>.

For reference, priorities may be set between the first operation task 132 and the second operation task 134. For example, the first operation task 132 may have higher priority to the second operation task 134. However, in this description, priorities may not be set between the first operation task 132 and the second operation task 134. That is, in this description, there is no priority between the first operation task 132 and the second operation task 134.

Described with a detailed example will be an operation of the memory system 110 in accordance with an embodiment of the present invention.

Figure 5A:
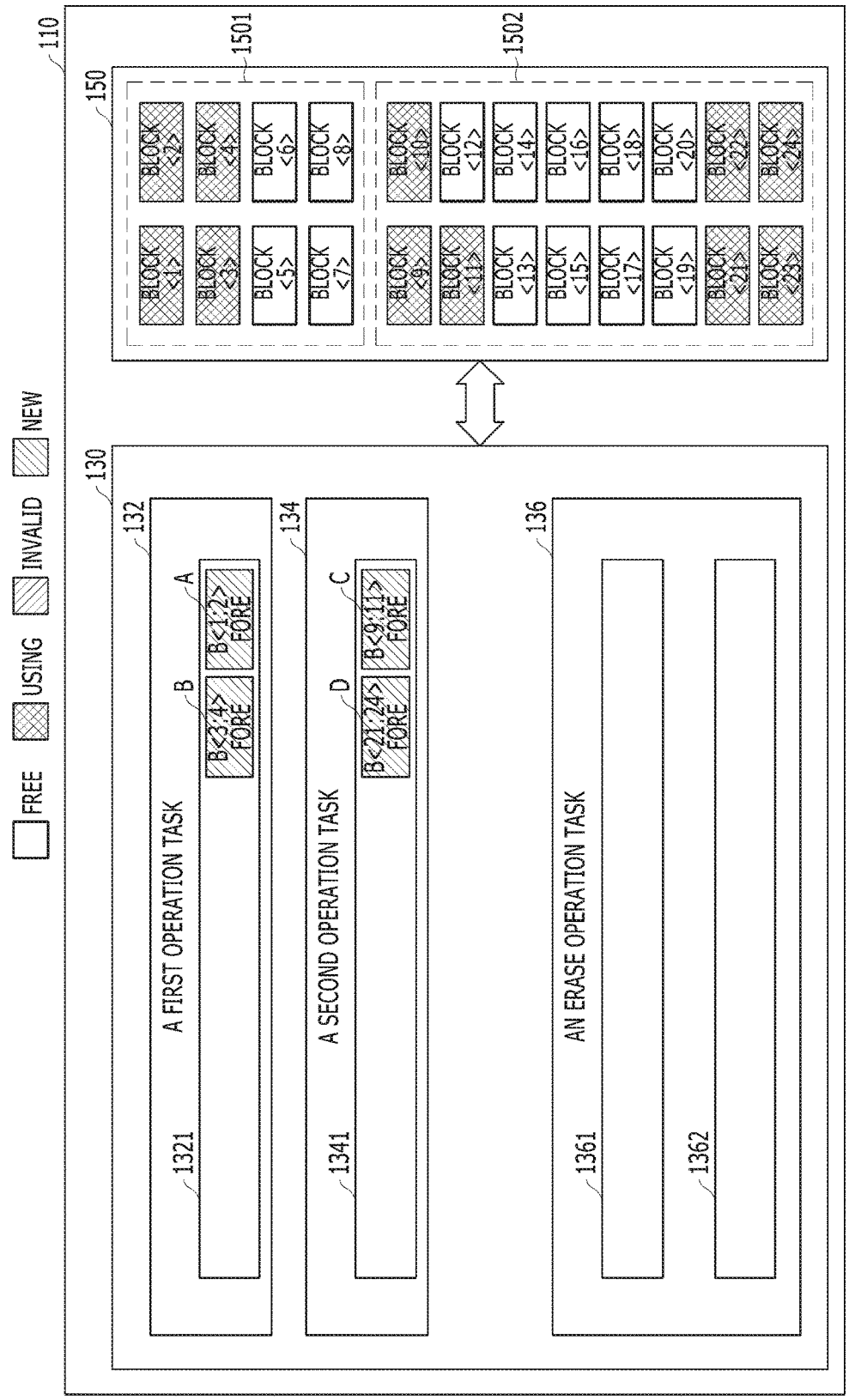

FIG. 5A exemplifies partial memory blocks BLOCK<1:4, 9:11, 21:24> in "being used" status USING in response to requests for foreground operations FORE from the host 102 among the plurality of memory blocks BLOCK<1:24>.

Originally, all of the plurality of memory blocks BLOCK<1:24> included in the nonvolatile memory device 150 may be in free status FREE.

In this case, information of "A" operation indicating a foreground operation to the first and second memory blocks BLOCK<1, 2>, information of "B" operation indicating a foreground operation to the third and fourth memory blocks BLOCK<3, 4>, information of "C" operation indicating a foreground operation to the ninth to eleventh memory blocks BLOCK<9:11> and information of "D" operation indicating a foreground operation to the $21^{st}$ to $24^{th}$ memory blocks BLOCK<21:24> may be provided from the host 102. At this time, all command information included in the information of the "A" to "D" operations indicate a command for a program operation.

As such, when the information of the "A" to "D" operations is provided from the host 102, the controller 130 may select one between the first operation task 132 and the second operation task 134 for each of the "A" to "D" operations by referencing address information respectively corresponding to the information of the "A" to "D" operations.

Since address information of the information of the "A" operation and the information of the "B" operation respectively correspond to the first and second memory blocks BLOCK<1, 2> and the third and fourth memory blocks BLOCK<3, 4>, the controller 130 may include the address information of the information of the "A" operation and the information of the "B" operation in the first operation list 1321 for the first operation task 132.

Since address information of the information of the "C" operation and the information of the "D" operation respectively correspond to the ninth to eleventh memory blocks BLOCK<9:11> and the $21^{st}$ to $24^{th}$ memory blocks BLOCK<21:24>, the controller 130 may include the address information of the information of the "C" operation and the information of the "D" operation in the second operation list 1341 for the second operation task 134.

When the first operation task 132 completes the process of the information of the "A" operation and the information of the "B" operation included in the first operation list 1321, the first and second memory blocks BLOCK<1, 2> and the third and fourth memory blocks BLOCK<3, 4> of the first group 1501 of the memory blocks BLOCK<1:8> may be programmed with data (not illustrated) provided from the host 102. Therefore, the first and second memory blocks BLOCK<1, 2> and the third and fourth memory blocks BLOCK<3, 4> may be changed to be in the "being used" status USING from the free status FREE.

When the second operation task 134 completes the process of the information of the "C" operation and the information of the "D" operation included in the second operation list 1341, the ninth to eleventh memory blocks BLOCK<9:11> and the $21^{st}$ to $24^{th}$ memory blocks BLOCK<21:24> of the second group 1502 of the memory blocks BLOCK<9:24> may be programmed with data (not illustrated) provided from the host 102. Therefore, the ninth to eleventh memory blocks BLOCK<9:11> and the $21^{st}$ to $24^{th}$ memory blocks BLOCK<21:24> may be changed to be in the "being used" status USING from the free status FREE.

FIG. 5B exemplifies, when the host 102 requests foreground operation FORE to partial memory blocks BLOCK<1:2, 9:11, 21:24> and then subsequently background operation BACK to partial memory blocks BLOCK<1:2, 11, 21> is internally requested among the plurality of memory blocks BLOCK<1:24>, the partial memory blocks BLOCK<1:2, 11, 21> are determined as target blocks of an erase operation as process results of the requested operation.

As the information of the "A" to "D" operations are processed as described with reference to FIG. 5A, the first and second memory blocks BLOCK<1, 2>, the third and fourth memory blocks BLOCK<3, 4>, the ninth to eleventh memory blocks BLOCK<9:11> and the $21^{st}$ to $24^{th}$ memory blocks BLOCK<21:24> may be in the "being used" status USING among the plurality of memory blocks BLOCK<1:24>.

In this situation, information of "E" operation indicating a foreground operation FORE to the first and second memory blocks BLOCK<1, 2>, information of "G" operation indicating a foreground operation FORE to the ninth to eleventh memory blocks BLOCK<9:11> and information of "H" operation indicating a foreground operation FORE to the $21^{st}$ to $24^{th}$ memory blocks BLOCK<21:24> may be provided from the host 102. Also, information of "F" operation indicating a background operation BACK to the first and second memory blocks BLOCK<1, 2> and information of "I" operation indicating a background operation BACK to the eleventh to $21^{st}$ memory blocks BLOCK<11:21> may be internally decided. At this time, all of the command information included in the information of the "E", "G" and "H" foreground operations FORE indicates a command for a program operation. Further, all of the command information included in the information of the "F" and "I" background operations BACK indicates a command for a garbage collection operation. Still further, the information of the "F" and "I" background operations BACK is processed as a process result of the information of the "E", "G" and "H" foreground operations FORE after the information of the "E", "G" and "H" foreground operations FORE is processed.

As such, when the information of the "E", "G" and "H" foreground operations FORE is provided and the information of the "F" and "I" background operations BACK is internally decided, the controller 130 may select one between the first operation task 132 and the second operation task 134 for each of the information of the "E" to "I" operations.

Since address information of the information of the "E" operation and the information of the "F" operation correspond to the first and second memory blocks BLOCK<1, 2> in the first group 1501 of the memory blocks BLOCK<1:8>, the controller 130 may include the address information of the information of the "E" operation and the information of the "F" operation in the first operation list 1321 for the first operation task 132.

Since address information of the information of the "G" operation, the information of the "H" operation and the information of the "I" operation respectively correspond to the ninth to eleventh memory blocks BLOCK<9:11>, the $21^{st}$ to $24^{th}$ memory blocks BLOCK<21:24> and the eleventh to $21^{st}$ memory blocks BLOCK<11:21> in the second group 1502 of the memory blocks BLOCK<9:24>, the controller 130 may include the address information of the information of the "G" operation, the information of the "H" operation and the information of the "I" operation in the second operation list 1341 for the second operation task 134.

In order for the first operation task 132 to complete the process of the information of the "E" operation included in the first operation list 1321, each of the first and second memory blocks BLOCK<1, 2> in the first group 1501 of the memory blocks BLOCK<1:8> should be programmed with data (not illustrated) provided from the host 102. At this time, the first and second memory blocks BLOCK<1, 2> are already in the "being used" status USING as a process result of the information of the "A" operation described with reference to FIG. 5A.

When a great amount of data (not illustrated) provided from the host 102 in correspondence to the information of the "E" operation is a duplicate of data (not illustrated) already stored in the first and second memory blocks BLOCK<1, 2> as the process result of the information of the "A" operation described with reference to FIG. 5A, the duplicate data (not illustrated) provided from the host 102 in correspondence to the information of the "E" operation may be programmed into one or more memory blocks in the free status FREE, for example the fifth memory block BLOCK<5>, in the first group 1501 of the memory blocks BLOCK<1:8>. Accordingly, the fifth memory block BLOCK<5> may be changed to be in the "being used" status USING from the free status FREE.

As such, after the information of the "E" operation included in the first operation list 1321 of the first operation task 132 is processed, the controller 130 may identify the first and second memory blocks BLOCK<1, 2> to have valid data running low and then the information of the "F" operation may be generated. Therefore, while the information of the "F" operation is being processed, a garbage collection operation to be performed to the first and second memory blocks BLOCK<1, 2> may be a series of operations of copying valid data of the first and second memory blocks BLOCK<1, 2> into one or more memory block in the free status FREE, for example, the sixth memory block BLOCK<6> in the first group 1501 of the memory blocks BLOCK<1:8> and then invalidating whole data of the first and second memory blocks BLOCK<1, 2>. As such, when the process of the information of the "F" operation is completed, the sixth memory block BLOCK<6> may be changed to be in the "being used" status USING from the free status FREE.

When the process of the information of the "F" operation is completed, whole data stored in the first and second memory blocks BLOCK<1, 2> may be invalidated and thus the first and second memory blocks BLOCK<1, 2> may require an erase operation. Accordingly, after the process of the information of the "F" operation is completed, the controller 130 may store respective address information B1 and B2 of the first and second memory blocks BLOCK<1, 2> into the erase operation task 136. At this time, since the first and second memory blocks BLOCK<1, 2> are included in the first group 1501 of the memory blocks BLOCK<1:8>, the address information B1 and B2 of the first and second memory blocks BLOCK<1, 2> may be stored into the first erase operation list 1361 of the erase operation task 136.

As such, after the address information B1 and B2 of the first and second memory blocks BLOCK<1, 2> are stored into the first erase operation list 1361 of the erase operation task 136, the controller 130 may check whether a first predetermined condition is satisfied and may determine whether or not the erase operation task 136 actually performs an erase operation to the first and second memory blocks BLOCK<1, 2> corresponding to the address information B1 and B2 stored in the first erase operation list 1361 based on the check result. The controller 130 may control the erase operation task 136 in order to actually perform an erase operation to the first and second memory blocks BLOCK<1, 2> corresponding to the address information B1 and B2 stored in the first erase operation list 1361 when the first predetermined condition is satisfied. The controller 130 may control the erase operation task 136 not to actually perform an erase operation to the first and second memory blocks BLOCK<1, 2> corresponding to the address information B1 and B2 stored in the first erase operation list 1361 when the first predetermined condition is not satisfied. Therefore, the address information B1 and B2 stored in the first erase operation list 1361 may be maintained.

In summary, since a process result of a first predetermined operation, for example, the information of the "F" operation through the first operation task 132 of the controller 130, there may be a need for an erase operation to be performed to one or more memory blocks, for example, the first and second memory blocks BLOCK<1, 2> in the first group 1501 of the memory blocks BLOCK<1:8>. In this situation, the controller 130 may include into the first erase operation list 1361 of the erase operation task 136 the address information, for example, the address information B1 and B2 of the erase-operation-required blocks, for example, the first and second memory blocks BLOCK<1, 2>. After that, when the first predetermined condition is satisfied, the controller 130 may perform an erase operation through the erase operation task 136 to a first portion of blocks in the first and second memory blocks BLOCK<1, 2>, the address information of which are included in the first erase operation list 1361.

In order for the second operation task 134 to complete the process of the information of the "G" operation and the information of the "H" operation included in the second operation list 1341, each of the ninth to eleventh memory blocks BLOCK<9:11> and the $21^{st}$ to $24^{th}$ memory blocks BLOCK<21:24> in the second group 1502 of the memory blocks BLOCK<9:24> should be programmed with data (not illustrated) provided from the host 102.

At this time, the eleventh and 21$^{st}$ memory blocks BLOCK<11, 21> among the ninth to eleventh memory blocks BLOCK<9:11> and the 21$^{st}$ to 24$^{th}$ memory blocks BLOCK<21:24> are already in the "being used" status USING as process results of the information of the "C" operation and the information of the "D" operation described with reference to FIG. 5A.

When a great amount of data (not illustrated), which is provided from the host 102 in correspondence to the information of the "G" operation and the information of the "H" operation and is to be programmed into the eleventh and 21$^{st}$ memory blocks BLOCK<11, 21> among the ninth to eleventh memory blocks BLOCK<9:11> and the 21$^{st}$ to 24$^{th}$ memory blocks BLOCK<21:24>, is a duplicate of data (not illustrated) already stored in the eleventh and 21$^{st}$ memory blocks BLOCK<11, 21> as the process results of the information of the "C" operation and the information of the "D" operation described with reference to FIG. 5A, the duplicate data (not illustrated) provided from the host 102 in correspondence to the information of the "G" operation and the information of the "H" operation may be programmed into one or more memory blocks in the free status FREE, for example the 12$^{th}$ memory block BLOCK<12> in the second group 1502 of the memory blocks BLOCK<9:24>. Accordingly, the 12$^{th}$ memory block BLOCK<12> may be changed to be in the "being used" status USING from the free status FREE.

However, when data (not illustrated), which is provided from the host 102 in correspondence to the information of the "G" operation and the information of the "H" operation and is to be programmed into the ninth, tenth and 22$^{nd}$ to 24$^{th}$ memory blocks BLOCK<9, 10, 22:24> among the ninth to eleventh memory blocks BLOCK<9:11> and the 21$^{st}$ to 24$^{th}$ memory blocks BLOCK<21:24>, is not a duplicate of data (not illustrated) already stored in the ninth, tenth and 22$^{nd}$ to 24$^{th}$ memory blocks BLOCK<9, 10, 22:24> as the process results of the information of the "C" operation and the information of the "D" operation described with reference to FIG. 5A, the data (not illustrated) provided from the host 102 in correspondence to the information of the "G" operation and the information of the "H" operation may be programmed as originally arranged in the ninth, tenth and 22$^{nd}$ to 24$^{th}$ memory blocks BLOCK<9, 10, 22:24> among the ninth to eleventh memory blocks BLOCK<9:11> and the 21$^{st}$ to 24$^{th}$ memory blocks BLOCK<21:24>.

As such, after the information of the "G" operation and the information of the "H" operation included in the second operation list 1341 of the second operation task 134 is processed, the controller 130 may identify the eleventh and 21$^{st}$ memory blocks BLOCK<11, 21> to have valid data running low and then the information of the "I" operation may be generated. Therefore, while the information of the "I" operation is being processed, a garbage collection operation to be performed to the eleventh and 21$^{st}$ memory blocks BLOCK<11, 21> may be a series of operations of copying valid data of the eleventh and 21$^{st}$ memory blocks BLOCK<11, 21> into one or more memory block in the free status FREE, for example the 13$^{th}$ memory block BLOCK<13> in the second group 1502 of the memory blocks BLOCK<9:24> and then invalidating whole data of the eleventh and 21$^{st}$ memory blocks BLOCK<11, 21>. As such, when the process of the information of the "I" operation is completed, the 13$^{th}$ memory block BLOCK<13> may be changed to be in the "being used" status USING from the free status FREE.

When the process of the information of the "I" operation is completed, whole data stored in the eleventh and 21$^{st}$ memory blocks BLOCK<11, 21> may be invalidated and thus the eleventh and 21$^{st}$ memory blocks BLOCK<11, 21> may require an erase operation. Accordingly, after the process of the information of the "I" operation is completed, the controller 130 may store respective address information B11 and B21 of the eleventh and 21$^{st}$ memory blocks BLOCK<11, 21> into the erase operation task 136. At this time, since the eleventh and 21$^{st}$ memory blocks BLOCK<11, 21> are included in the second group 1502 of the memory blocks BLOCK<9:24>, the address information B11 and B21 of the eleventh and 21$^{st}$ memory blocks BLOCK<11, 21> may be stored into the second erase operation list 1362 of the erase operation task 136.

As such, after the address information B11 and B21 of the eleventh and 21$^{st}$ memory blocks BLOCK<11, 21> are stored into the second erase operation list 1362 of the erase operation task 136, the controller 130 may check whether a second predetermined condition is satisfied and may determine whether or not the erase operation task 136 actually performs an erase operation to the eleventh and 21$^{st}$ memory blocks BLOCK<11, 21> corresponding to the address information B11 and B21 stored in the second erase operation list 1362 based on the check result. The controller 130 may control the erase operation task 136 in order to actually perform an erase operation to the eleventh and 21$^{st}$ memory blocks BLOCK<11, 21> corresponding to the address information B11 and B21 stored in the second erase operation list 1362 when the second predetermined condition is satisfied. The controller 130 may control the erase operation task 136 not to actually perform an erase operation to the eleventh and 21$^{st}$ memory blocks BLOCK<11, 21> corresponding to the address information B11 and B21 stored in the second erase operation list 1362 when the second predetermined condition is not satisfied. Therefore, the address information B11 and B21 stored in the second erase operation list 1362 may be maintained.

In summary, since a process result of a second predetermined operation for example, the information of the "I" operation through the second operation task 134 of the controller 130, there may be a need for an erase operation to be performed to one or more memory blocks for example, the eleventh and 21$^{st}$ memory blocks BLOCK<11, 21> in the second group 1502 of the memory blocks BLOCK<9:24>. In this situation, the controller 130 may include into the second erase operation list 1362 of the erase operation task 136 the address information for example, the address information B11 and B21 of the erase-operation-required blocks for example, the eleventh and 21$^{st}$ memory blocks BLOCK<11, 21>. After that, when the second predetermined condition is satisfied, the controller 130 may perform an erase operation through the erase operation task 136 to a second portion of blocks in the eleventh and 21$^{st}$ memory blocks BLOCK<11, 21>, the address information of which are included in the second erase operation list 1362.

The first and second predetermined conditions may be set as follows.

As described above, the first predetermined condition may correspond to the first erase operation list 1361 of the erase operation task 136 and the second predetermined condition may correspond to the second erase operation list 1362 of the erase operation task 136. The first predetermined condition may be a criterion to determine whether to perform an erase operation to the first group 1501 of the memory blocks BLOCK<1:8> and the second predetermined condition may be a criterion to determine whether to perform an erase operation to the second group 1502 of the memory blocks BLOCK<9:24>. The first and second predetermined condition may be independent from each other.

The controller 130 may check whether the first predetermined condition is satisfied whenever all operations managed by the first operation task 132 except for the erase operation is performed N times. The controller 130 may check whether the second predetermined condition is satisfied whenever all operations managed by the second operation task 134 except for the erase operation is performed M times. N and M may be a natural number greater than 1 and may be the same as or different from each other. When each of N and M has a small value, the first and second predetermined conditions may be checked more frequently and there may be a greater processing burden to the controller 130.

Particularly, the controller 130 may determine the first predetermined condition is satisfied when a ratio of memory blocks BLOCK<7:8> in the free status FREE to memory blocks BLOCK<3:6> in the "being used" status USING in the first group 1501 of the memory blocks BLOCK<1:8> is below a first predetermined threshold ratio, for example 25%, or when a number of memory blocks BLOCK<7:8> in the free status FREE is below a first predetermined threshold number, for example a number of 1.

When the process of the information of the "E" operation and the information of the "F" operation described with reference to FIG. 5B is completed, whether the first predetermined condition is satisfied is determined as follows.

A number of memory blocks in the "being used" status USING in the first group 1501 of the memory blocks BLOCK<1:8> may be 4 of the third to sixth memory blocks BLOCK<3:6>. A number of memory blocks in the free status FREE in the first group 1501 of the memory blocks BLOCK<1:8> may be 2 of the seventh and eighth memory blocks BLOCK<7:8>. Therefore, the ratio of memory blocks BLOCK<7:8> in the free status FREE to memory blocks BLOCK<3:6> in the "being used" status USING in the first group 1501 of the memory blocks BLOCK<1:8> may be 50% and thus greater than the first predetermined threshold ratio of 25%. Also, since the number of memory blocks in the free status FREE in the first group 1501 of the memory blocks BLOCK<1:8> is 2 of the seventh and eighth memory blocks BLOCK<7:8>, it is greater than the first predetermined threshold number of 1.

Accordingly, after the process of the information of the "E" operation and the information of the "F" operation is completed as described with reference to FIG. 5B, the controller 130 may determine the first predetermined condition is not satisfied. Therefore, the controller 130 may control the erase operation task 136 not to actually perform an erase operation to the first portion of memory blocks in the first and second memory blocks BLOCK<1, 2> corresponding to the address information B1 and B2 stored in the first erase operation list 1361 and the address information B1 and B2 stored in the first erase operation list 1361 may be maintained.

Further, the controller 130 may determine the second predetermined condition as satisfied when a ratio of memory blocks BLOCK<14:20> in the free status FREE to memory blocks BLOCK<9:10, 12, 13, 22:24> in the "being used" status USING in the second group 1502 of the memory blocks BLOCK<9:24> is below a second predetermined threshold ratio, for example 50%, or when a number of memory blocks BLOCK<14:20> in the free status FREE is below a second predetermined threshold number, for example a number of 4.

When the process of the information of the "G" operation, the information of the "H" operation and the information of the "I" operation described with reference to FIG. 5B is completed, how the second predetermined condition is satisfied is determined as follows.

A number of memory blocks in the "being used" status USING in the second group 1502 of the memory blocks BLOCK<9:24> may be 7 of the ninth, tenth, $12^{th}$, $13^{th}$ and $22^{nd}$ to $24^{th}$ memory blocks BLOCK<9:10, 12, 13, 22:24>. A number of memory blocks in the free status FREE in the second group 1502 of the memory blocks BLOCK<9:24> may be 7 of the $14^{th}$ to $20^{th}$ memory blocks BLOCK<14:20>. Therefore, the ratio of memory blocks BLOCK<14:20> in the free status FREE to memory blocks BLOCK<9:10, 12, 13, 22:24> in the "being used" status USING in the second group 1502 of the memory blocks BLOCK<9:24> may be 100% and thus greater than the first predetermined threshold ratio of 50%. Also, since the number of memory blocks in the free status FREE in the second group 1502 of the memory blocks BLOCK<9:24> is 7 of the $14^{th}$ to $20^{th}$ memory blocks BLOCK<14:20>, it is greater than the second predetermined threshold number of 4.

Accordingly, after the process of the information of the "G" operation, the information of the "H" operation and the information of the "I" operation is completed as described with reference to FIG. 5B, the controller 130 may determine the second predetermined condition is not satisfied. Therefore, the controller 130 may control the erase operation task 136 not to actually perform an erase operation to the eleventh and $21^{st}$ memory blocks BLOCK<11, 21> corresponding to the address information B11 and B21 stored in the second erase operation list 1362 and the address information B11 and B21 stored in the second erase operation list 1362 may be maintained.

FIG. 5C exemplifies, when the host 102 requests a foreground operation FORE to partial memory blocks BLOCK<5, 9:10, 12:14> of the plurality of memory blocks BLOCK<1:24> and then subsequently a background operation BACK to partial memory blocks BLOCK<5, 9:10, 12:14> of the plurality of memory blocks BLOCK<1:24> is internally requested, the partial memory blocks BLOCK<5, 9:10, 12:14> are determined as target blocks of an erase operation as process results of the requested operation.

As the information of the "A" to "I" operations are processed as described with reference to FIGS. 5A and 5B, the $3^{rd}$ to $6^{th}$ memory blocks BLOCK<3:6>, the $9^{th}$, $10^{th}$, $12^{th}$, $13^{th}$ and $22^{nd}$ to $24^{th}$ memory blocks BLOCK<9, 10, 12, 13, 22:24> may be in the "being used" status USING and the first and second memory blocks BLOCK<1, 2> and the eleventh and $21^{st}$ memory blocks BLOCK<11, 21> may be in an invalidated status INVALID among the plurality of memory blocks BLOCK<1:24>. Further, the address information B1 and B2 corresponding to the first and second memory blocks BLOCK<1, 2> may be stored in the first erase operation list 1361 of the erase operation task 136 and the address information B11 and B21 corresponding to the eleventh to $21^{st}$ memory blocks BLOCK<11:21> may be stored in the second erase operation list 1362 of the erase operation task 136.

In this situation, information of "J" operation indicating a foreground operation FORE to the $5^{th}$ memory block BLOCK<5>, information of "L" operation indicating a foreground operation FORE to the ninth to tenth memory blocks BLOCK<9:10> and information of "M" operation indicating a foreground operation FORE to the 12$^{th}$ to 14$^{th}$ memory blocks BLOCK<12:14> may be provided from the host 102. Also, information of "K" operation indicating a background operation BACK to the 5$^{th}$ memory block BLOCK<5> and information of "N" operation indicating a background operation BACK to the ninth and 12$^{th}$ memory blocks BLOCK<9, 12> may be internally decided. At this time, all of the command information included in the information of the "J", "K" and "M" foreground operations FORE indicates a command for a program operation. Further, that all of the command information included in the information of the "K" and "N" background operations BACK indicate a command for a garbage collection operation. Still further, the information of the "K" and "N" background operations BACK is processed as a process result of the information of the "J" "L" and "M" foreground operations FORE after the information of the "J", "L" and "M" foreground operations FORE is processed.

As such, when the information of the "J", "L" and "M" foreground operations FORE is provided and the information of the "K" and "N" background operations BACK is internally decided, the controller 130 may select one between the first operation task 132 and the second operation task 134 for each of the information of the "J" to "N" operations.

Since address information of the information of the "J" operation and the information of the "K" operation correspond to the 5$^{th}$ memory block BLOCK<5> in the first group 1501 of the memory blocks BLOCK<1:8>, the controller 130 may include the address information of the information of the "J" operation and the information of the "K" operation in the first operation list 1321 for the first operation task 132.

Since address information of the information of the "L" operation, the information of the "M" operation and the information of the "N" operation respectively correspond to the ninth to tenth memory blocks BLOCK<9, 10>, the 12$^{th}$ to 14$^{th}$ memory blocks BLOCK<12:14> and the ninth and 12$^{th}$ memory blocks BLOCK<9, 12> in the second group 1502 of the memory blocks BLOCK<9:24>, the controller 130 may include the address information of the information of the "L" operation, the information of the "M" operation and the information of the "N" operation in the second operation list 1341 for the second operation task 134.

In order for the first operation task 132 to complete the process of the information of the "J" operation included in the first operation list 1321, each of the 5$^{th}$ memory block BLOCK<5> in the first group 1501 of the memory blocks BLOCK<1:8> should be programmed with data (not illustrated) provided from the host 102. At this time, the 5$^{th}$ memory block BLOCK<5> is already in the "being used" status USING, as a process result of the information of the "E" operation described with reference to FIG. 5B.

When a great amount of data (not illustrated) provided from the host 102 in correspondence to the information of the "J" operation is a duplicate of data (not illustrated) already stored in the 5$^{th}$ memory block BLOCK<5> as the process result of the information of the "E" operation described with reference to FIG. 5B, the duplicate data (not illustrated) provided from the host 102 in correspondence to the information of the "J" operation may be programmed into one or more memory blocks in the free status FREE, for example the seventh memory block BLOCK<7> in the first group 1501 of the memory blocks BLOCK<1:8>. Accordingly, the seventh memory block BLOCK<7> may be changed to be in the "being used" status USING from the free status FREE.

As such, after the information of the "J" operation included in the first operation list 1321 of the first operation task 132 is processed, the controller 130 may identify the 5$^{th}$ memory block BLOCK<5> to have valid data running low and then the information of the "K" operation may be generated. Therefore, while the information of the "K" operation is being processed, a garbage collection operation to be performed to the 5$^{th}$ memory block BLOCK<5> may be a series of operations of copying valid data of the 5$^{th}$ memory block BLOCK<5> into one or more memory blocks in the free status FREE, for example the 8$^{th}$ memory block BLOCK<8> in the first group 1501 of the memory blocks BLOCK<1:8> and then invalidating whole data of the 5$^{th}$ memory block BLOCK<5>. As such, when the process of the information of the "K" operation is completed, the 8$^{th}$ memory block BLOCK<8> may be changed to be in the "being used" status USING from the free status FREE.

When the process of the information of the "K" operation is completed, whole data stored in the 5$^{th}$ memory block BLOCK<5> may be invalidated and thus the 5$^{th}$ memory block BLOCK<5> may require an erase operation. Accordingly, after the process of the information of the "K" operation is completed, the controller 130 may store respective address information B5 of the 5$^{th}$ memory block BLOCK<5> into the erase operation task 136. At this time, since the 5$^{th}$ memory block BLOCK<5> is included in the first group 1501 of the memory blocks BLOCK<1:8>, the address information B5 of the 5$^{th}$ memory block BLOCK<5> may be stored into the first erase operation list 1361 of the erase operation task 136.

As such, after the address information B5 of the 5$^{th}$ memory block BLOCK<5> is stored into the first erase operation list 1361 of the erase operation task 136, the controller 130 may check whether the first predetermined condition is satisfied and may determine whether or not the erase operation task 136 actually performs an erase operation to the first, second and 5$^{th}$ memory blocks BLOCK<1:2, 5> corresponding to the address information B1, B2 and B5 stored in the first erase operation list 1361 based on the check result. The controller 130 may control the erase operation task 136 in order to actually perform an erase operation to the first, second and 5$^{th}$ memory blocks BLOCK<1:2, 5> corresponding to the address information B1, B2 and B5 stored in the first erase operation list 1361 when the first predetermined condition is satisfied. The controller 130 may control the erase operation task 136 not to actually perform an erase operation to the first, second and 5$^{th}$ memory blocks BLOCK<1:2, 5> corresponding to the address information B1, B2 and B5 stored in the first erase operation list 1361 when the first predetermined condition is not satisfied. Therefore, the address information B1, B2 and B5 stored in the first erase operation list 1361 may be maintained.

In summary, since a process result of a first predetermined operation for example, the information of the "K" operation through the first operation task 132 of the controller 130, there may be a need for an erase operation to be performed to one or more memory blocks for example, the 5$^{th}$ memory block BLOCK<5> in the first group 1501 of the memory blocks BLOCK<1:8>. In this situation, the controller 130 may include into the first erase operation list 1361 of the erase operation task 136 the address information for example, the address information B5 of the erase-operation-required blocks for example, the 5$^{th}$ memory block BLOCK<5>. After that, when the first predetermined condition is satisfied, the controller 130 may perform an erase operation through the erase operation task 136 to the first portion of blocks in the first, second and 5$^{th}$ memory blocks BLOCK<1:2, 5>, the address information of which are included in the first erase operation list 1361.

When the process of the information of the "J" operation and the information of the "K" operation described with reference to FIG. 5C is completed, how the first predetermined condition is satisfied is determined as follows.

A number of memory blocks in the "being used" status USING in the first group 1501 of the memory blocks BLOCK<1:8> may be 5 of the third, fourth and sixth to 8$^{th}$ memory blocks BLOCK<3, 4, 6:8>. There may be no block in the free status FREE in the first group 1501 of the memory blocks BLOCK<1:8>. Therefore, the ratio of memory blocks in the free status FREE to memory blocks BLOCK<3, 4, 6:8> in the "being used" status USING in the first group 1501 of the memory blocks BLOCK<1:8> may be 0% and thus less than the first predetermined threshold ratio of 25%. Also, since there is no memory block in the free status FREE in the first group 1501 of the memory blocks BLOCK<1:8>, it is less than the first predetermined threshold number of 1.

Accordingly, after the process of the information of the "J" operation and the information of the "K" operation is completed as described with reference to FIG. 5C, the controller 130 may determine that the first predetermined condition is satisfied. Therefore, the controller 130 may control the erase operation task 136 in order to actually perform an erase operation to the first portion of memory blocks in the first, second and 5$^{th}$ memory blocks BLOCK<1:2, 5> corresponding to the address information B1, B2 and B5 stored in the first erase operation list 1361.

Here, the controller 130 may control a number of the first portion of memory blocks to be selected among the first, second and 5$^{th}$ memory blocks BLOCK<1:2, 5> corresponding to the address information B1, B2 and B5 stored in the first erase operation list 1361 according to a difference in the number of memory blocks in the free status FREE in the first group 1501 of the memory blocks BLOCK<1:8> and the number of the first, second and 5$^{th}$ memory blocks BLOCK<1:2, 5> corresponding to the address information B1, B2 and B5 stored in the first erase operation list 1361.

The controller 130 may control the erase operation task 136 in order to perform an erase operation such that an erase operation is performed not to all memory blocks BLOCK<1: 2, 5> corresponding to all of the address information B1, B2 and B5 stored in the first erase operation list 1361 but to the first portion of memory blocks BLOCK<1, 2> selected among the first, second and 5$^{th}$ memory blocks BLOCK<1: 2, 5> corresponding to the address information B1, B2 and B5 stored in the first erase operation list 1361.

For example, as exemplified above, there may be no block in the free status FREE in the first group 1501 of the memory blocks BLOCK<1:8>. Also as exemplified above, a number of memory blocks in the invalidated status INVALID as the target of an erase operation through the erase operation task 136 may be 3 of the first, second and 5$^{th}$ memory blocks BLOCK<1:2, 5>. Therefore, the difference in the number of memory blocks in the free status FREE in the first group 1501 of the memory blocks BLOCK<1:8> and the number of the first, second and 5$^{th}$ memory blocks BLOCK<1:2, 5> corresponding to the address information B1, B2 and B5 stored in the first erase operation list 1361 may be 3. For example, the first and second memory blocks BLOCK<1, 2> may be selected as the first portion of memory blocks among the first, second and 5$^{th}$ memory blocks BLOCK<1:2, 5> corresponding to the address information B1, B2 and B5 stored in the first erase operation list 1361 and an erase operation may be performed to the selected first and second memory blocks BLOCK<1, 2>. When the erase operation is performed to the selected first and second memory blocks BLOCK<1, 2> as exemplified above, the first and second memory blocks BLOCK<1, 2> may be changed to be in the free status FREE from the invalidated status INVALID. As illustrated in FIG. 5D, the first and second memory blocks BLOCK<1, 2> may be in the free status FREE in the first group 1501 of the memory blocks BLOCK<1:8>.

In order for the second operation task 134 to complete the process of the information of the "L" operation and the information of the "M" operation included in the second operation list 1341, each of the ninth and tenth memory blocks BLOCK<9, 10> and the 12$^{th}$ to 14$^{th}$ memory blocks BLOCK<12:14> in the second group 1502 of the memory blocks BLOCK<9:24> should be programmed with data (not illustrated) provided from the host 102.

At this time, the ninth and 12$^{th}$ memory blocks BLOCK<9, 12> among the ninth and tenth memory blocks BLOCK<9, 10> and the 12$^{th}$ to 14$^{th}$ memory blocks BLOCK<12:14> are already in the "being used" status USING as process results of the information of the "G" operation and the information of the "H" operation described with reference to FIG. 5B.

When a great amount of data (not illustrated), which is provided from the host 102 in correspondence to the information of the "L" operation and the information of the "M" operation and is to be programmed into the ninth and 12$^{th}$ memory blocks BLOCK<9, 12> among the ninth and tenth memory blocks BLOCK<9, 10> and the 12$^{th}$ to 14$^{th}$ memory blocks BLOCK<12:14>, is a duplicate of data (not illustrated) already stored in the ninth and 12$^{th}$ memory blocks BLOCK<9, 12> as the process results of the information of the "G" operation and the information of the "H" operation described with reference to FIG. 5B, the duplicate data (not illustrated) provided from the host 102 in correspondence to the information of the "L" operation and the information of the "M" operation may be programmed into one or more memory blocks in the free status FREE, for example the 15$^{th}$ memory block BLOCK<15> in the second group 1502 of the memory blocks BLOCK<9:24>. Accordingly, the 15$^{th}$ memory block BLOCK<15> may be changed to be in the "being used" status USING from the free status FREE.

However, when data (not illustrated), which is provided from the host 102 in correspondence to the information of the "L" operation and the information of the "M" operation and is to be programmed into the tenth and 13$^{th}$ memory blocks BLOCK<10, 13> among the ninth and tenth memory blocks BLOCK<9, 10> and the 12$^{th}$ to 14$^{th}$ memory blocks BLOCK<12:14>, is not a duplicate of data (not illustrated) already stored in the tenth and 13$^{th}$ memory blocks BLOCK<10, 13> as the process results of the information of the "G" operation and the information of the "H" operation described with reference to FIG. 5B, the data (not illustrated) provided from the host 102 in correspondence to the information of the "L" operation and the information of the "M" operation may be programmed as originally arranged in the tenth and 13$^{th}$ memory blocks BLOCK<10, 13> among the ninth and tenth memory blocks BLOCK<9, 10> and the 12$^{th}$ to 14$^{th}$ memory blocks BLOCK<12:14>.

Also, since the 14$^{th}$ memory block BLOCK<14> is in the free status FREE as exemplified above, the data (not illustrated), which is provided from the host 102 in correspondence to the information of the "M" operation and is to be programmed into the 14$^{th}$ memory block BLOCK<14> among the ninth and tenth memory blocks BLOCK<9, 10> and the 12$^{th}$ to 14$^{th}$ memory blocks BLOCK<12:14> may be programmed as originally arranged in the 14$^{th}$ memory block BLOCK<14> among the ninth and tenth memory blocks BLOCK<9, 10> and the 12$^{th}$ to 14$^{th}$ memory blocks BLOCK<12:14>. The 14$^{th}$ memory block BLOCK<14> may be changed to be in the "being used" status USING from the free status FREE.

As such, after the information of the "L" operation and the information of the "M" operation included in the second operation list 1341 of the second operation task 134 is processed, the controller 130 may identify the ninth and 12$^{th}$ memory blocks BLOCK<9, 12> to have valid data running low and then the information of the "N" operation may be generated. Therefore, while the information of the "N" operation is being processed, a garbage collection operation to be performed to the ninth and 12$^{th}$ memory blocks BLOCK<9, 12> may be a series of operations of copying valid data of the ninth and 12$^{th}$ memory blocks BLOCK<9, 12> into one or more memory block in the free status FREE, for example the 16$^{th}$ memory block BLOCK<16> in the second group 1502 of the memory blocks BLOCK<9:24> and then invalidating whole data of the ninth and 12$^{th}$ memory blocks BLOCK<9, 12>. As such, when the process of the information of the "N" operation is completed, the 16$^{th}$ memory block BLOCK<16> may be changed to be in the "being used" status USING from the free status FREE.

When the process of the information of the "N" operation is completed, whole data stored in the ninth and 12$^{th}$ memory blocks BLOCK<9, 12> may be invalidated and thus the ninth and 12$^{th}$ memory blocks BLOCK<9, 12> may require an erase operation. Accordingly, after the process of the information of the "N" operation is completed, the controller 130 may store respective address information B9 and B12 of the ninth and 12$^{th}$ memory blocks BLOCK<9, 12> into the erase operation task 136. At this time, since the ninth and 12$^{th}$ memory blocks BLOCK<9, 12> are included in the second group 1502 of the memory blocks BLOCK<9:24>, the address information B9 and B12 of the ninth and 12$^{th}$ memory blocks BLOCK<9, 12> may be stored into the second erase operation list 1362 of the erase operation task 136.

As such, after the address information B9 and B12 of the ninth and 12$^{th}$ memory blocks BLOCK<9, 12> are stored into the second erase operation list 1362 of the erase operation task 136, the controller 130 may check whether the second predetermined condition is satisfied and may determine whether or not the erase operation task 136 actually performs an erase operation to the eleventh, 21$^{st}$, ninth and 12$^{th}$ memory blocks BLOCK<11, 21, 9, 12> corresponding to the address information B11, B21, B9 and B12 stored in the second erase operation list 1362 based on the check result. The controller 130 may control the erase operation task 136 in order to actually perform an erase operation to the eleventh, 21$^{st}$, ninth and 12$^{th}$ memory blocks BLOCK<11, 21, 9, 12> corresponding to the address information B11, B21, B9 and B12 stored in the second erase operation list 1362 when the second predetermined condition is satisfied. The controller 130 may control the erase operation task 136 not to actually perform an erase operation to the eleventh, 21$^{st}$, ninth and 12$^{th}$ memory blocks BLOCK<11, 21, 9, 12> corresponding to the address information B11, B21, B9 and B12 stored in the second erase operation list 1362 when the second predetermined condition is not satisfied. Therefore, the address information B11, B21, B9 and B12 stored in the second erase operation list 1362 may be maintained.

In summary, since a process result of a second predetermined operation for example, the information of the "N" operation through the second operation task 134 of the controller 130, there may be a need for an erase operation to be performed to one or more memory blocks (for example, the ninth and 12$^{th}$ memory blocks BLOCK<9, 12>) in the second group 1502 of the memory blocks BLOCK<9:24>. In this situation, the controller 130 may include into the second erase operation list 1362 of the erase operation task 136 the address information for example, the address information B9 and B12 of the erase-operation-required blocks for example, the ninth and 12$^{th}$ memory blocks BLOCK<9, 12>. After that, when the second predetermined condition is satisfied, the controller 130 may perform an erase operation through the erase operation task 136 to the second portion of blocks in the eleventh, 21$^{st}$, ninth and 12$^{th}$ memory blocks BLOCK<11, 21, 9, 12>, the address information of which are included in the second erase operation list 1362.

When the process of the information of the "L" operation, the information of the "M" operation and the information of the "N" operation described with reference to FIG. 5C is completed, hoe the second predetermined condition is satisfied is determined as follows.

A number of memory blocks in the "being used" status USING in the second group 1502 of the memory blocks BLOCK<9:24> may be 8 of the 10$^{th}$, 13$^{th}$ to 16$^{th}$ and 22$^{nd}$ to 24$^{th}$ memory blocks BLOCK<10, 13:16, 22:24>. A number of memory blocks in the free status FREE in the second group 1502 of the memory blocks BLOCK<9:24> may be 4 of the 17$^{th}$ to 20$^{th}$ memory blocks BLOCK<17:20>. Therefore, the ratio of memory blocks BLOCK<17:20> in the free status FREE to memory blocks BLOCK<10, 13:16, 22:24> in the "being used" status USING in the second group 1502 of the memory blocks BLOCK<9:24> may be 50% and thus the same as the first predetermined threshold ratio of 50%. Also, since the number of memory blocks in the free status FREE in the second group 1502 of the memory blocks BLOCK<9:24> is 4 of the 17$^{th}$ to 20$^{th}$ memory blocks BLOCK<17:20>, it is the same as the second predetermined threshold number of 4.

Accordingly, after the process of the information of the "L" operation, the information of the "M" operation and the information of the "N" operation is completed as described with reference to FIG. 5C, the controller 130 may determine the second predetermined condition is satisfied. Therefore, the controller 130 may control the erase operation task 136 in order to actually perform an erase operation to the eleventh, 21$^{st}$, ninth and 12$^{th}$ memory blocks BLOCK<11, 21, 9, 12> corresponding to the address information B11, B21, B9 and B12 stored in the second erase operation list 1362.

Here, the controller 130 may control a number of the second portion of memory blocks to be selected among the eleventh, 21$^{st}$, ninth and 12$^{th}$ memory blocks BLOCK<11, 21, 9, 12> corresponding to the address information B11, B21, B9 and B12 stored in the second erase operation list 1362 according to difference in the number of memory blocks in the free status FREE in the second group 1502 of the memory blocks BLOCK<9:24> and the number of the eleventh, 21$^{st}$, ninth and 12$^{th}$ memory blocks BLOCK<11, 21, 9, 12> corresponding to the address information B11, B21, B9 and B12 stored in the second erase operation list 1362.

The controller 130 may control the erase operation task 136 in order to perform an erase operation such that an erase operation is performed not to all memory blocks BLOCK<11, 21, 9, 12> corresponding to the address information B11, B21, B9 and B12 stored in the second erase operation list 1362 but to the second portion of memory block BLOCK<11> selected among the eleventh, $21^{st}$, ninth and $12^{th}$ memory blocks BLOCK<11, 21, 9, 12> corresponding to the address information B11, B21, B9 and B12 stored in the second erase operation list 1362.

For example, as exemplified above, a number of memory blocks in the free status FREE in the second group 1502 of the memory blocks BLOCK<9:24> may be 4 of the $17^{th}$ to $20^{th}$ memory blocks BLOCK<17:20>. Also as exemplified above, a number of memory blocks in the invalidated status INVALID as the target of an erase operation through the erase operation task 136 may be 4 of the eleventh, $21^{st}$, ninth and $12^{th}$ memory blocks BLOCK<11, 21, 9, 12>. Therefore, the difference in the number of memory blocks in the free status FREE in the second group 1502 of the memory blocks BLOCK<9:24> and the number of the eleventh, $21^{st}$, ninth and $12^{th}$ memory blocks BLOCK<11, 21, 9, 12> corresponding to the address information B11, B21, B9 and B12 stored in the second erase operation list 1362 may be 0 i.e., there is no difference in the numbers. For example, the eleventh memory block BLOCK<11> may be selected as the second portion of memory block among the eleventh, $21^{st}$, ninth and $12^{th}$ memory blocks BLOCK<11, 21, 9, 12> corresponding to the address information B11, B21, B9 and B12 stored in the second erase operation list 1362 and an erase operation may be performed to the selected eleventh memory block BLOCK<11>. When the erase operation is performed to the selected eleventh memory block BLOCK<11> as exemplified above, the eleventh memory block BLOCK<11> may be changed to be in the free status FREE from the invalidated status INVALID. As illustrated in FIG. 5D, the eleventh memory block BLOCK<11> may be in the free status FREE in the second group 1502 of the memory blocks BLOCK<9:24>.

FIG. 5D exemplifies, when the host 102 requests foreground operation FORE to partial memory blocks BLOCK<3, 4> of the plurality of memory blocks BLOCK<1:24> during the actual erase operation through the erase operation task 136 and background operation BACK to partial memory blocks BLOCK<15, 16> of the plurality of memory blocks BLOCK<1:24> is internally requested during the actual erase operation through the erase operation task 136, the partial memory blocks BLOCK<3, 4, 15, 16> determined as target blocks of an erase operation as process results of the requested operation.

As the information of the "A", "B", "E", "F", "J" and "K" operations are processed as described with reference to FIGS. 5A to 5C, the $3^{rd}$ and $4^{th}$ and $6^{th}$ to $8^{th}$ memory blocks BLOCK<3, 4, 6:8> may be in the "being used" status USING and the first, second and $5^{th}$ memory blocks BLOCK<1, 2, 5> may be in an invalidated status INVALID in the first group 1501 of the memory blocks BLOCK<1:8>. Further, the address information B1, B2 and B5 corresponding to the first, second and $5^{th}$ memory blocks BLOCK<1, 2, 5> may be stored in the first erase operation list 1361 of the erase operation task 136.

In a situation that the controller 130 starts performing an erase operation to the first and second memory blocks BLOCK<1, 2> among the first, second and $5^{th}$ memory blocks BLOCK<1, 2, 5> included in the first erase operation list 1361 of the erase operation task 136, the host 102 may provide information of the "O" operation requesting a foreground operation FORE to the third and fourth memory blocks BLOCK<3, 4>. At this time, a command included in the information of the "O" operation requesting a foreground operation FORE to the third and fourth memory blocks BLOCK<3, 4> is a read command. Since address information of the information of the "O" operation requesting a foreground operation FORE corresponds to the third and fourth memory blocks BLOCK<3, 4> of the first group 1501 of the memory blocks BLOCK<1:8>, the controller 130 may include the information of the "O" operation in the first operation list 1321 in order for the first operation task 132 to manage the "O" operation.

As such when the information of the "O" operation is provided from the host 102 during the erase operation to the first and second memory blocks BLOCK<1, 2> among the first, second and $5^{th}$ memory blocks BLOCK<1, 2, 5> included in the first erase operation list 1361 of the erase operation task 136, the controller 130 may suspend the erase operation to the first and second memory blocks BLOCK<1, 2> among the first, second and $5^{th}$ memory blocks BLOCK<1, 2, 5> included in the first erase operation list 1361 of the erase operation task 136.

Then, the controller 130 may process the information of the "O" operation through the first operation task 132. That is, the controller 130 may control the read operation of reading data (not illustrated) from the third and fourth memory blocks BLOCK<3, 4> of the first group 1501 of the memory blocks BLOCK<1:8> and outputting the read data.

As such, when the process of the information of the "O" operation through the first operation task 132 is completed, the controller 130 may resume the suspended erase operation to the first and second memory blocks BLOCK<1, 2> among the first, second and $5^{th}$ memory blocks BLOCK<1, 2, 5> included in the first erase operation list 1361 of the erase operation task 136.

To sum up, while the controller 130 is controlling an erase operation to memory blocks e.g., the first and second memory blocks BLOCK<1, 2> included in the first erase operation list 1361 through the erase operation task 136, information of foreground operation FORE e.g., the information of the "O" operation may be provided among all operations managed through the first operation task 132 except for the erase operation. In this case, the controller 130 may suspend the erase operation to memory blocks e.g., the first and second memory blocks BLOCK<1, 2> included in the first erase operation list 1361 through the erase operation task 136, and may process the information of foreground operation FORE e.g., the information of the "O" operation. When the process of the information of foreground operation FORE e.g., the information of the "O" operation is completed, the controller 130 may resume the suspended erase operation to memory blocks e.g., the first and second memory blocks BLOCK<1, 2> included in the first erase operation list 1361 through the erase operation task 136.

When the erase operation to memory blocks e.g., the first and second memory blocks BLOCK<1, 2> included in the first erase operation list 1361 through the erase operation task 136 is completed, the memory blocks e.g., the first and second memory blocks BLOCK<1, 2> may be changed to be in the free status FREE from the invalidated status INVALID. Also, the address information B1 and B2 of the memory blocks e.g., the first and second memory blocks BLOCK<1, 2> may be deleted among the address information B1, B2 and B5 of the first, second and $5^{th}$ memory blocks BLOCK<1:2, 5> included in the first erase operation list 1361 of the erase operation task 136 and thus the address information B5 of the $5^{th}$ memory block BLOCK<5> may remain in the first erase operation list 1361 of the erase operation task 136.

FIG. 5D exemplifies an erase operation of the erase operation task 136 suspended and resumed by the first operation task 132 but the erase operation of the erase operation task 136 may be suspended and resumed by the second operation task 134.

For example, while the controller 130 is controlling an erase operation to memory blocks included in the second erase operation list 1362 through the erase operation task 136, information of the foreground operation FORE may be provided among all operations managed through the second operation task 134 except for the erase operation. In this case, the controller 130 may suspend the erase operation to memory blocks included in the second erase operation list 1362 through the erase operation task 136, and may process the information of foreground operation FORE through the second operation task 134. When the process of the information of foreground operation FORE is completed through the second operation task 134, the controller 130 may resume the suspended erase operation to memory blocks included in the second erase operation list 1362 through the erase operation task 136.

As the information of the "C", "D", "G", "H", "I", "L", "M" and "N" operations are processed as described with reference to FIGS. 5A to 5C, the $10^{th}$, $13^{th}$ to $16^{th}$ and $22^{nd}$ to $24^{th}$ memory blocks BLOCK<10, 13:16, 22:24> may be in the "being used" status USING and the $11^{th}$, $21^{st}$, $9^{th}$ and $12^{th}$ memory blocks BLOCK<11, 21, 9, 12> may be in an invalidated status INVALID in the second group 1502 of the memory blocks BLOCK<9:24>. Further, the address information B11, B21, B9 and B12 corresponding to the $11^{th}$, $21^{st}$, $9^{th}$ and $12^{th}$ memory blocks BLOCK<11, 21, 9, 12> may be stored in the second erase operation list 1362 of the erase operation task 136.

In a situation that the controller 130 starts performing an erase operation to the $11^{th}$ memory block BLOCK<11> among the $11^{th}$, $21^{st}$, $9^{th}$ and $12^{th}$ memory blocks BLOCK<11, 21, 9, 12> included in the second erase operation list 1362 of the erase operation task 136, information of the "P" operation requesting a background operation BACK to the $15^{th}$ and $16^{th}$ memory blocks BLOCK<15, 16> may be internally generated. At this time, a command included in the information of the "P" operation requesting a background operation BACK to the $15^{th}$ and $16^{th}$ memory blocks BLOCK<15, 16> is a map update command. Since address information of the information of the "P" operation requesting a background operation BACK corresponds to the $15^{th}$ and $16^{th}$ memory blocks BLOCK<15, 16> of the second group 1502 of the memory blocks BLOCK<9:24>, the controller 130 may include the information of the "P" operation in the second operation list 1341 in order for the second operation task 134 to manage the "P" operation.

As such even when the information of the "P" operation is internally generated during the erase operation to the $11^{th}$ memory block BLOCK<11> among the $11^{th}$, $21^{st}$, $9^{th}$ and $12^{th}$ memory blocks BLOCK<11, 21, 9, 12> included in the second erase operation list 1362 of the erase operation task 136, the controller 130 may keep controlling the erase operation to the $11^{th}$ memory block BLOCK<11> among the $11^{th}$, $21^{st}$, $9^{th}$ and $12^{th}$ memory blocks BLOCK<11, 21, 9, 12> included in the second erase operation list 1362 of the erase operation task 136 without suspension of the erase operation to the $11^{th}$ memory block BLOCK<11> among the $11^{th}$, $21^{st}$, $9^{th}$ and $12^{th}$ memory blocks BLOCK<11, 21, 9, 12> included in the second erase operation list 1362 of the erase operation task 136. After completion of the erase operation to the $11^{th}$ memory block BLOCK<11> among the $11^{th}$, $21^{st}$, $9^{th}$ and $12^{th}$ memory blocks BLOCK<11, 21, 9, 12> included in the second erase operation list 1362 of the erase operation task 136, the controller 130 may control the second operation task 134 in order to process the information of the "P" operation included in the second operation list 1341.

To sum up, the controller 130 may give higher priority to an erase operation managed through the erase operation task 136 than a background operation among all operations managed through the second operation task 134. Therefore, while the controller 130 is controlling an erase operation to memory blocks e.g., the $11^{th}$ memory block BLOCK<11> included in the second erase operation list 1362 of the erase operation task 136, the controller 130 may keep controlling an erase operation to memory blocks e.g., the $11^{th}$ memory block BLOCK<11> included in the second erase operation list 1362 of the erase operation task 136 even when information of the background operation e.g., the information of the "P" operation is internally generated during the erase operation to memory blocks e.g., the $11^{th}$ memory block BLOCK<11> included in the second erase operation list 1362 of the erase operation task 136. The controller 130 may hold the process of the information of the background operation e.g., the information of the "P" operation in the second operation list 1341 until the completion of the erase operation to memory blocks e.g., the $11^{th}$ memory block BLOCK<11> included in the second erase operation list 1362 of the erase operation task 136. When the erase operation to memory blocks e.g., the $11^{th}$ memory block BLOCK<11> included in the second erase operation list 1362 of the erase operation task 136 is completed, the controller 130 may process the information of background operation e.g., the information of the "P" operation in the second operation list 1341.

When the erase operation to memory blocks e.g., the $11^{th}$ memory block BLOCK<11>, included in the second erase operation list 1362 through the erase operation task 136 is completed, the memory blocks e.g., the second erase operation list 1362, may be changed to be in the free status FREE from the invalidated status INVALID. Also, the address information B11 of the memory blocks e.g., the $11^{th}$ memory block BLOCK<11>, may be deleted among the address information B11, B21, B9 and B12 of the $11^{th}$, $21^{st}$, $9^{th}$ and $12^{th}$ memory blocks BLOCK<11, 21, 9, 12> included in the second erase operation list 1362 of the erase operation task 136 and thus the address information B21, B9 and B12 of the $21^{st}$, $9^{th}$ and $12^{th}$ memory blocks BLOCK<11, 21, 9, 12> may remain in the second erase operation list 1362 of the erase operation task 136.

FIG. 5D exemplifies an erase operation of the erase operation task 136 kept being performed through the erase operation task 136 even when a background operation is requested to the second operation task 134, but the erase operation of the erase operation task 136 may be kept being performed even when a background operation is requested to the first operation task 132.

For example, the controller 130 may give higher priority to an erase operation managed through the erase operation task 136 than a background operation among all operations managed through the first operation task 132. Therefore, while the controller 130 is controlling an erase operation to memory blocks included in the first erase operation list 1361 of the erase operation task 136, the controller 130 may keep controlling an erase operation to memory blocks included in the first erase operation list 1361 of the erase operation task 136 even when information of a background operation is internally generated during the erase operation to memory blocks included in the first erase operation list 1361 of the erase operation task 136. The controller 130 may hold the processing of the information of background operation in the first operation list 1321 until the completion of the erase operation to memory blocks included in the first erase operation list 1361 of the erase operation task 136. When the erase operation to memory blocks included in the first erase operation list 1361 of the erase operation task 136 is completed, the controller 130 may process the information of background operation in the first operation list 1321.

As described above, in accordance with an embodiment of the present invention, an erase operation to the plurality of memory blocks BLOCK<1:24> of the nonvolatile memory device 150 may be independently managed through the erase operation task. That is, an erase operation to the plurality of memory blocks BLOCK<1:24> of the nonvolatile memory device 150 may be independently managed through the erase operation task and all operations except for the erase operation to the plurality of memory blocks BLOCK<1:24> of the nonvolatile memory device 150 may be independently managed through the operation tasks.

Therefore, an erase operation may be performed at the most effective time point independently from other operations, and the erase operation may least affect other operations.

FIGS. 6 to 14 are diagrams schematically illustrating application examples of the data processing system of FIGS. 1 to 5*d* according to various embodiments.

Figure 6:
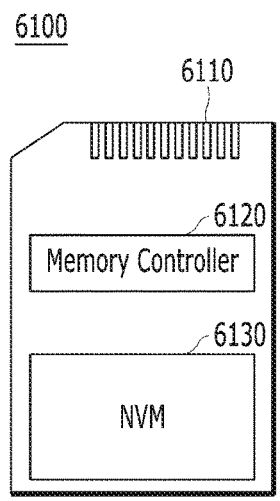
FIGS. 6 to 14 are diagrams schematically illustrating application examples of a data processing system, in accordance with various embodiments of the present invention.

FIG. 6 is a diagram schematically illustrating an example of the data processing system including the memory system in accordance with an embodiment. FIG. 6 schematically illustrates a memory card system to which the memory system in accordance with an embodiment is applied.

Referring to FIG. 6, the memory card system 6100 may include a memory controller 6120, a memory device 6130 and a connector 6110.

More specifically, the memory controller 6120 may be connected to the memory device 6130 embodied by a nonvolatile memory, and configured to access the memory device 6130. For example, the memory controller 6120 may be configured to control read, write, erase and background operations of the memory device 6130. The memory controller 6120 may be configured to provide an interface between the memory device 6130 and a host, and drive firmware for controlling the memory device 6130. That is, the memory controller 6120 may correspond to the controller 130 of the memory system 110 described with reference to FIGS. 1 to 5*d*, and the memory device 6130 may correspond to the memory device 150 of the memory system 110 described with reference to FIGS. 1 to 5*d*.

Thus, the memory controller 6120 may include a RAM, a processing unit, a host interface, a memory interface and an error correction unit. The memory controller 130 may further include the elements described in FIG. 1.

The memory controller 6120 may communicate with an external device, for example, the host 102 of FIG. 1 through the connector 6110. For example, as described with reference to FIG. 1, the memory controller 6120 may be configured to communicate with an external device through one or more of various communication protocols such as universal serial bus (USB), multimedia card (MMC), embedded MMC (eMMC), peripheral component interconnection (PCI), PCI express (PCIe), Advanced Technology Attachment (ATA), Serial-ATA, Parallel-ATA, small computer system interface (SCSI), enhanced small disk interface (EDSI), Integrated Drive Electronics (IDE), Firewire, universal flash storage (UFS), WIFI and Bluetooth. Thus, the memory system and the data processing system in accordance with an embodiment may be applied to wired/wireless electronic devices or particularly mobile electronic devices.

The memory device 6130 may be implemented by a nonvolatile memory. For example, the memory device 6130 may be implemented by various nonvolatile memory devices such as an erasable and programmable ROM (EPROM), an electrically erasable and programmable ROM (EEPROM), a NAND flash memory, a NOR flash memory, a phase-change RAM (PRAM), a resistive RAM (ReRAM), a ferroelectric RAM (FRAM) and a spin torque transfer magnetic RAM (STT-RAM). The memory device 6130 may include a plurality of dies as in the memory device 150 of FIG. 1.

The memory controller 6120 and the memory device 6130 may be integrated into a single semiconductor device. For example, the memory controller 6120 and the memory device 6130 may construct a solid state driver (SSD) by being integrated into a single semiconductor device. Also, the memory controller 6120 and the memory device 6130 may construct a memory card such as a PC card (PCMCIA: Personal Computer Memory Card International Association), a compact flash (CF) card, a smart media card (e.g., SM and SMC), a memory stick, a multimedia card (e.g., MMC, RS-MMC, MMCmicro and eMMC), an SD card (e.g., SD, miniSD, microSD and SDHC) and a universal flash storage (UFS).

Figure 7:
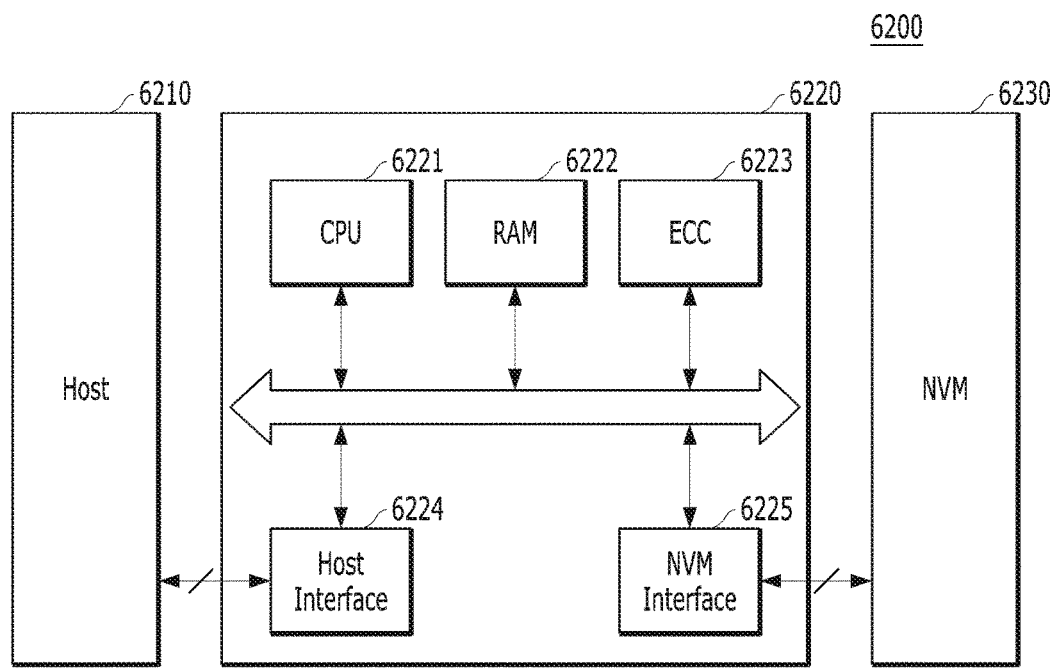

FIG. 7 is a diagram schematically illustrating another example of the data processing system including a memory system, in accordance with an embodiment.

Referring to FIG. 7, the data processing system 6200 may include a memory device 6230 having one or more nonvolatile memories and a memory controller 6220 for controlling the memory device 6230. The data processing system 6200 illustrated in FIG. 7 may serve as a storage medium such as a memory card (CF, SD, micro-SD or the like) or USB device, as described with reference to FIG. 1. The memory device 6230 may correspond to the memory device 150 in the memory system 110 described in FIGS. 1 to 5*d*, and the memory controller 6220 may correspond to the controller 130 in the memory system 110 described in FIGS. 1 to 5*d*.

The memory controller 6220 may control a read, write, or erase operation on the memory device 6230 in response to a request of the host 6210, and the memory controller 6220 may include one or more CPUs 6221, a buffer memory such as RAM 6222, an ECC circuit 6223, a host interface 6224 and a memory interface such as an NVM interface 6225.

The CPU 6221 may control the operations for the memory device 6230, for example, read, write, file system management and bad page management operations. The RAM 6222 may be operated according to control of the CPU 6221, and used as a work memory, buffer memory or cache memory. When the RAM 6222 is used as a work memory, data processed by the CPU 6221 may be temporarily stored in the RAM 6222. When the RAM 6222 is used as a buffer memory, the RAM 6222 may be used for buffering data transmitted to the memory device 6230 from the host 6210 or transmitted to the host 6210 from the memory device 6230. When the RAM 6222 is used as a cache memory, the RAM 6222 may assist the low-speed memory device 6230 to operate at high speed.

The ECC circuit 6223 may correspond to the ECC unit 138 of the controller 130 illustrated in FIG. 1. As described with reference to FIG. 1, the ECC circuit 6223 may generate an ECC (Error Correction Code) for correcting a fail bit or error bit of data provided from the memory device 6230. The ECC circuit 6223 may perform error correction encoding on data provided to the memory device 6230, thereby forming data with a parity bit. The parity bit may be stored in the memory device 6230. The ECC circuit 6223 may perform error correction decoding on data outputted from the memory device 6230. At this time, the ECC circuit 6223 may correct an error using the parity bit. For example, as described with reference to FIG. 1, the ECC circuit 6223 may correct an error using the LDPC code, BCH code, turbo code, Reed-Solomon code, convolution code, RSC or coded modulation such as TCM or BCM.

The memory controller 6220 may transmit/receive data to/from the host 6210 through the host interface 6224, and transmit/receive data to/from the memory device 6230 through the NVM interface 6225. The host interface 6224 may be connected to the host 6210 through a PATA bus, SATA bus, SCSI, USB, PCIe, or NAND interface. The memory controller 6220 may have a wireless communication function with a mobile communication protocol such as WiFi or Long Term Evolution (LTE). The memory controller 6220 may be connected to an external device, for example, the host 6210 or another external device, and then transmit/receive data to/from the external device. In particular, as the memory controller 6220 is configured to communicate with the external device through one or more of various communication protocols, the memory system and the data processing system in accordance with an embodiment may be applied to wired/wireless electronic devices or particularly a mobile electronic device.

Figure 8:
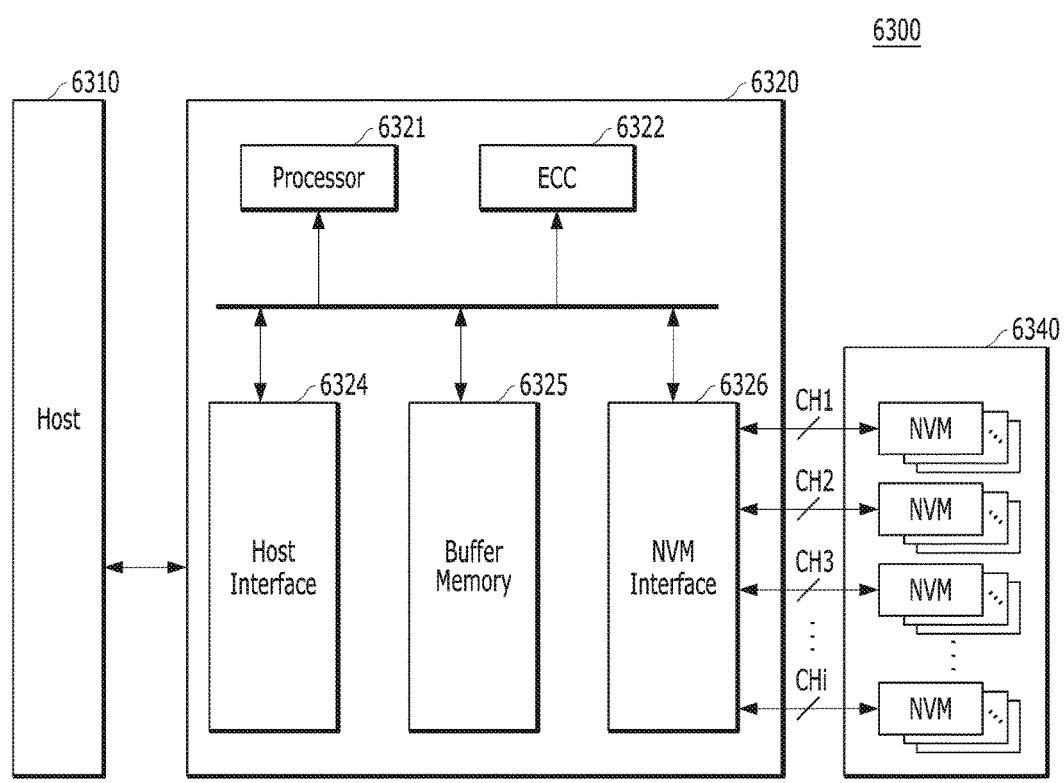

FIG. 8 is a diagram schematically illustrating another example of the data processing system including the memory system in accordance with an embodiment. FIG. 8 schematically illustrates an SSD to which the memory system in accordance with an embodiment is applied.

Referring to FIG. 8, the SSD 6300 may include a controller 6320 and a memory device 6340 including a plurality of nonvolatile memories. The controller 6320 may correspond to the controller 130 in the memory system 110 of FIG. 1, and the memory device 6340 may correspond to the memory device 150 in the memory system of FIG. 1.

More specifically, the controller 6320 may be connected to the memory device 6340 through a plurality of channels CH1 to CHi. The controller 6320 may include one or more processors 6321, a buffer memory 6325, an ECC circuit 6322, a host interface 6324 and a memory interface, for example, a nonvolatile memory interface 6326.

The buffer memory 6325 may temporarily store data provided from the host 6310 or data provided from a plurality of flash memories NVM included in the memory device 6340, or temporarily store meta data of the plurality of flash memories NVM, for example, map data including a mapping table. The buffer memory 6325 may be embodied by volatile memories such as DRAM, SDRAM, DDR SDRAM, LPDDR SDRAM and GRAM or nonvolatile memories such as FRAM, ReRAM, STT-MRAM and PRAM. For convenience of description, FIG. 8 illustrates that the buffer memory 6325 exists in the controller 6320. However, the buffer memory 6325 may exist outside the controller 6320.

The ECC circuit 6322 may calculate an ECC value of data to be programmed to the memory device 6340 during a program operation, perform an error correction operation on data read from the memory device 6340 based on the ECC value during a read operation, and perform an error correction operation on data recovered from the memory device 6340 during a failed data recovery operation.

The host interface 6324 may provide an interface function with an external device, for example, the host 6310, and the nonvolatile memory interface 6326 may provide an interface function with the memory device 6340 connected through the plurality of channels.

Furthermore, a plurality of SSDs 6300 to which the memory system 110 of FIG. 1 is applied may be provided to embody a data processing system, for example, RAID (Redundant Array of Independent Disks) system. At this time, the RAID system may include the plurality of SSDs 6300 and a RAID controller for controlling the plurality of SSDs 6300. When the RAID controller performs a program operation in response to a write command provided from the host 6310, the RAID controller may select one or more memory systems or SSDs 6300 according to a plurality of RAID levels, that is, RAID level information of the write command provided from the host 6310 in the SSDs 6300, and output data corresponding to the write command to the selected SSDs 6300. Furthermore, when the RAID controller performs a read command in response to a read command provided from the host 6310, the RAID controller may select one or more memory systems or SSDs 6300 according to a plurality of RAID levels, that is, RAID level information of the read command provided from the host 6310 in the SSDs 6300, and provide data read from the selected SSDs 6300 to the host 6310.

Figure 9:
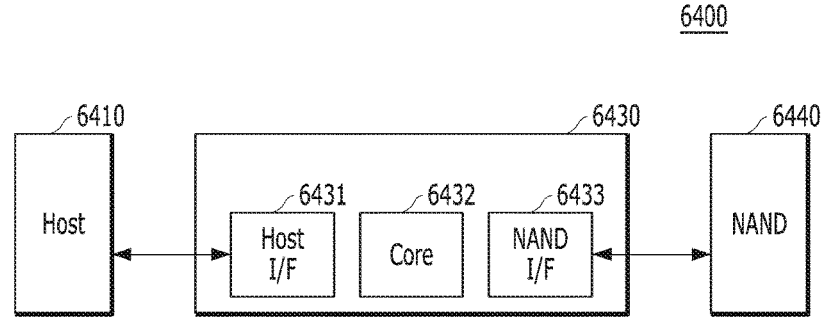

FIG. 9 is a diagram schematically illustrating another example of the data processing system including the memory system in accordance with an embodiment. FIG. 9 schematically illustrates an embedded Multi-Media Card (eMMC) to which the memory system in accordance with an embodiment is applied.

Referring to FIG. 9, the eMMC 6400 may include a controller 6430 and a memory device 6440 embodied by one or more NAND flash memories. The controller 6430 may correspond to the controller 130 in the memory system 110 of FIG. 1, and the memory device 6440 may correspond to the memory device 150 in the memory system 110 of FIG. 1.

More specifically, the controller 6430 may be connected to the memory device 6440 through a plurality of channels. The controller 6430 may include one or more cores 6432, a host interface 6431 and a memory interface, for example, a NAND interface 6433.

The core 6432 may control the operations of the eMMC 6400, the host interface 6431 may provide an interface function between the controller 6430 and the host 6410, and the NAND interface 6433 may provide an interface function between the memory device 6440 and the controller 6430. For example, the host interface 6431 may serve as a parallel interface, for example, MMC interface as described with reference to FIG. 1. Furthermore, the host interface 6431 may serve as a serial interface, for example, UHS ((Ultra High Speed)-I/UHS-II) interface.

FIGS. 10 to 13 are diagrams schematically illustrating other examples of the data processing system including the memory system in accordance with an embodiment. FIGS. 10 to 13 schematically illustrate UFS (Universal Flash Storage) systems to which the memory system in accordance with an embodiment is applied.

Referring to FIGS. 10 to 13, the UFS systems 6500, 6600, 6700 and 6800 may include hosts 6510, 6610, 6710 and 6810, UFS devices 6520, 6620, 6720 and 6820 and UFS cards 6530, 6630, 6730 and 6830, respectively. The hosts 6510, 6610, 6710 and 6810 may serve as application processors of wired/wireless electronic devices or particularly mobile electronic devices, the UFS devices 6520, 6620, 6720 and 6820 may serve as embedded UFS devices, and the UFS cards 6530, 6630, 6730 and 6830 may serve as external embedded UFS devices or removable UFS cards.

The hosts 6510, 6610, 6710 and 6810, the UFS devices 6520, 6620, 6720 and 6820 and the UFS cards 6530, 6630, 6730 and 6830 in the respective UFS systems 6500, 6600, 6700 and 6800 may communicate with external devices, for example, wired/wireless electronic devices or particularly mobile electronic devices through UFS protocols, and the UFS devices 6520, 6620, 6720 and 6820 and the UFS cards 6530, 6630, 6730 and 6830 may be embodied by the memory system 110 illustrated in FIG. 1. For example, in the UFS systems 6500, 6600, 6700 and 6800, the UFS devices 6520, 6620, 6720 and 6820 may be embodied in the form of the data processing system 6200, the SSD 6300 or the eMMC 6400 described with reference to FIGS. 7 to 9, and the UFS cards 6530, 6630, 6730 and 6830 may be embodied in the form of the memory card system 6100 described with reference to FIG. 6.

Furthermore, in the UFS systems 6500, 6600, 6700 and 6800, the hosts 6510, 6610, 6710 and 6810, the UFS devices 6520, 6620, 6720 and 6820 and the UFS cards 6530, 6630, 6730 and 6830 may communicate with each other through an UFS interface, for example, MIPI M-PHY and MIPI UniPro (Unified Protocol) in MIPI (Mobile Industry Processor Interface). Furthermore, the UFS devices 6520, 6620, 6720 and 6820 and the UFS cards 6530, 6630, 6730 and 6830 may communicate with each other through various protocols other than the UFS protocol, for example, UFDs, MMC, SD, mini-SD, and micro-SD.

Figure 10:
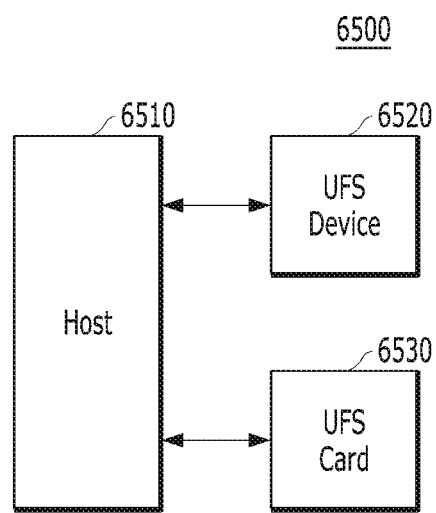

In the UFS system 6500 illustrated in FIG. 10, each of the host 6510, the UFS device 6520 and the UFS card 6530 may include UniPro. The host 6510 may perform a switching operation in order to communicate with the UFS device 6520 and the UFS card 6530. In particular, the host 6510 may communicate with the UFS device 6520 or the UFS card 6530 through link layer switching, for example, L3 switching at the UniPro. At this time, the UFS device 6520 and the UFS card 6530 may communicate with each other through link layer switching at the UniPro of the host 6510. In an embodiment, the configuration in which one UFS device 6520 and one UFS card 6530 are connected to the host 6510 has been exemplified for convenience of description. However, a plurality of UFS devices and UFS cards may be connected in parallel or in the form of a star to the host 6410, and a plurality of UFS cards may be connected in parallel or in the form of a star to the UFS device 6520 or connected in series or in the form of a chain to the UFS device 6520.

Figure 11:
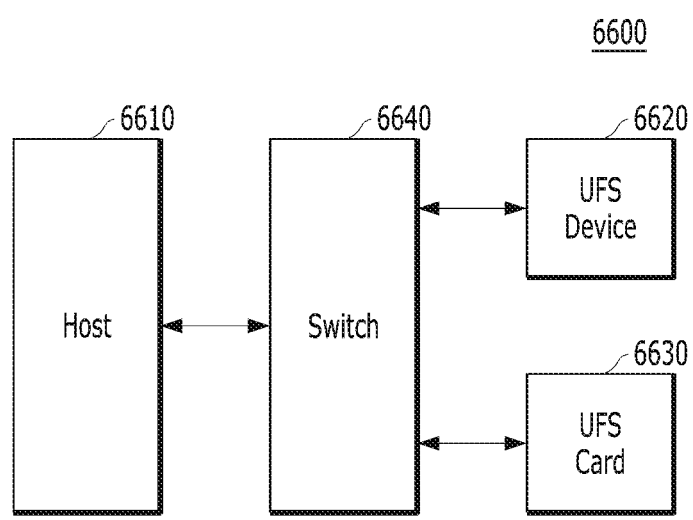

In the UFS system 6600 illustrated in FIG. 11, each of the host 6610, the UFS device 6620 and the UFS card 6630 may include UniPro, and the host 6610 may communicate with the UFS device 6620 or the UFS card 6630 through a switching module 6640 performing a switching operation, for example, through the switching module 6640 which performs link layer switching at the UniPro, for example, L3 switching. The UFS device 6620 and the UFS card 6630 may communicate with each other through link layer switching of the switching module 6640 at UniPro. In an embodiment, the configuration in which one UFS device 6620 and one UFS card 6630 are connected to the switching module 6640 has been exemplified for convenience of description. However, a plurality of UFS devices and UFS cards may be connected in parallel or in the form of a star to the switching module 6640, and a plurality of UFS cards may be connected in series or in the form of a chain to the UFS device 6620.

Figure 12:
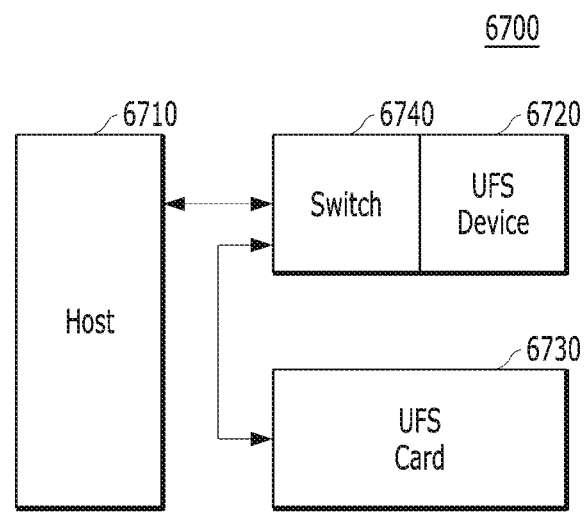

In the UFS system 6700 illustrated in FIG. 12, each of the host 6710, the UFS device 6720 and the UFS card 6730 may include UniPro, and the host 6710 may communicate with the UFS device 6720 or the UFS card 6730 through a switching module 6740 performing a switching operation, for example, through the switching module 6740 which performs link layer switching at the UniPro, for example, L3 switching. At this time, the UFS device 6720 and the UFS card 6730 may communicate with each other through link layer switching of the switching module 6740 at the UniPro, and the switching module 6740 may be integrated as one module with the UFS device 6720 inside or outside the UFS device 6720. In an embodiment, the configuration in which one UFS device 6720 and one UFS card 6730 are connected to the switching module 6740 has been exemplified for convenience of description. However, a plurality of modules each including the switching module 6740 and the UFS device 6720 may be connected in parallel or in the form of a star to the host 6710 or connected in series or in the form of a chain to each other. Furthermore, a plurality of UFS cards may be connected in parallel or in the form of a star to the UFS device 6720.

Figure 13:
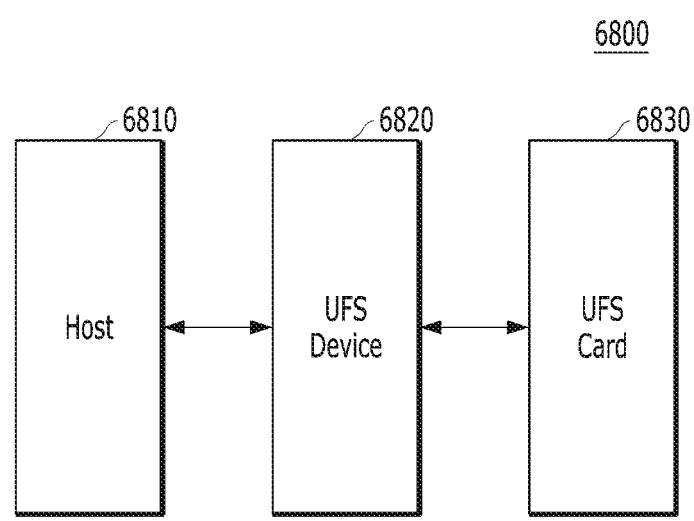

In the UFS system 6800 illustrated in FIG. 13, each of the host 6810, the UFS device 6820 and the UFS card 6830 may include M-PHY and UniPro. The UFS device 6820 may perform a switching operation in order to communicate with the host 6810 and the UFS card 6830. In particular, the UFS device 6820 may communicate with the host 6810 or the UFS card 6830 through a switching operation between the M-PHY and UniPro module for communication with the host 6810 and the M-PHY and UniPro module for communication with the UFS card 6830, for example, through a target ID (Identifier) switching operation. At this time, the host 6810 and the UFS card 6830 may communicate with each other through target ID switching between the M-PHY and UniPro modules of the UFS device 6820. In an embodiment, the configuration in which one UFS device 6820 is connected to the host 6810 and one UFS card 6830 is connected to the UFS device 6820 has been exemplified for convenience of description. However, a plurality of UFS devices may be connected in parallel or in the form of a star to the host 6810, or connected in series or in the form of a chain to the host 6810, and a plurality of UFS cards may be connected in parallel or in the form of a star to the UFS device 6820, or connected in series or in the form of a chain to the UFS device 6820.

Figure 14:
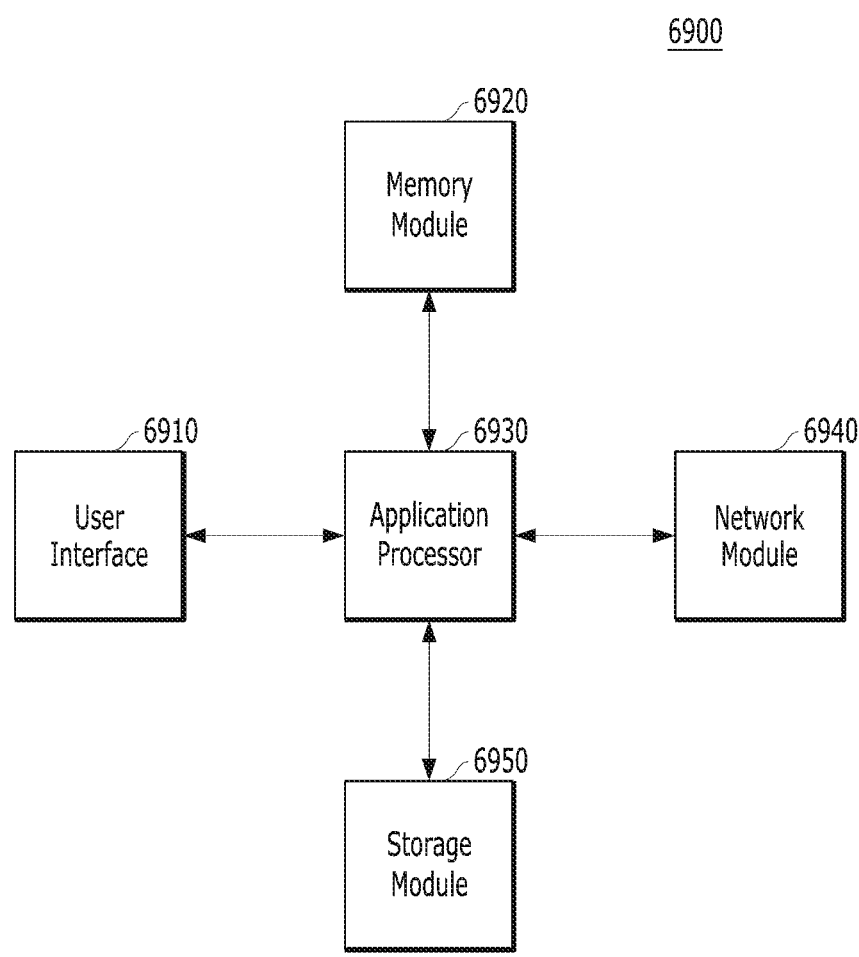

FIG. 14 is a diagram schematically illustrating another example of the data processing system including the memory system in accordance with an embodiment. FIG. 14 is a diagram schematically illustrating a user system to which the memory system in accordance with an embodiment is applied.

Referring to FIG. 14, the user system 6900 may include an application processor 6930, a memory module 6920, a network module 6940, a storage module 6950 and a user interface 6910.

More specifically, the application processor 6930 may drive components included in the user system 6900, for example, an OS, and include controllers, interfaces and a graphic engine which control the components included in the user system 6900. The application processor 6930 may be provided as a System-on-Chip (SoC).

The memory module 6920 may be used as a main memory, work memory, buffer memory or cache memory of the user system 6900. The memory module 6920 may include a volatile RAM such as DRAM, SDRAM, DDR SDRAM, DDR2 SDRAM, DDR3 SDRAM, LPDDR SDARM, LPDDR3 SDRAM or LPDDR3 SDRAM or a nonvolatile RAM such as PRAM, ReRAM, MRAM or FRAM. For example, the application processor 6930 and the memory module 6920 may be packaged and mounted, based on POP (Package on Package).

The network module 6940 may communicate with external devices. For example, the network module 6940 may not only support wired communication, but may also support various wireless communication protocols such as code division multiple access (CDMA), global system for mobile communication (GSM), wideband CDMA (WCDMA), CDMA-2000, time division multiple access (TDMA), long term evolution (LTE), worldwide interoperability for microwave access (Wimax), wireless local area network (WLAN), ultra-wideband (UWB), Bluetooth, wireless display (WI-DI), thereby communicating with wired/wireless electronic devices or particularly mobile electronic devices. Therefore, the memory system and the data processing system, in accordance with an embodiment of the present invention, can be applied to wired/wireless electronic devices. The network module 6940 may be included in the application processor 6930.

The storage module 6950 may store data, for example, data received from the application processor 6930, and then may transmit the stored data to the application processor 6930. The storage module 6950 may be embodied by a nonvolatile semiconductor memory device such as a phase-change RAM (PRAM), a magnetic RAM (MRAM), a resistive RAM (ReRAM), a NAND flash, NOR flash and 3D NAND flash, and provided as a removable storage medium such as a memory card or external drive of the user system 6900. The storage module 6950 may correspond to the memory system 110 described with reference to FIG. 1. Furthermore, the storage module 6950 may be embodied as an SSD, eMMC and UFS as described above with reference to FIGS. 8 to 13.

The user interface 6910 may include interfaces for inputting data or commands to the application processor 6930 or outputting data to an external device. For example, the user interface 6910 may include user input interfaces such as a keyboard, a keypad, a button, a touch panel, a touch screen, a touch pad, a touch ball, a camera, a microphone, a gyroscope sensor, a vibration sensor and a piezoelectric element, and user output interfaces such as a liquid crystal display (LCD), an organic light emitting diode (OLED) display device, an active matrix OLED (AMOLED) display device, an LED, a speaker and a monitor.

Furthermore, when the memory system 110 of FIG. 1 is applied to a mobile electronic device of the user system 6900, the application processor 6930 may control the operations of the mobile electronic device, and the network module 6940 may serve as a communication module for controlling wired/wireless communication with an external device. The user interface 6910 may display data processed by the processor 6930 on a display/touch module of the mobile electronic device, or support a function of receiving data from the touch panel.

While the present invention has been described with respect to specific embodiments, it will be apparent to those skilled in the art that various changes and modifications may be made without departing from the spirit and scope of the invention as determined in the following claims.

What is claimed is:

1. A memory system comprising:
   a nonvolatile memory device including a plurality of memory blocks; and
   a controller suitable for dividing the plurality of memory blocks into a first group and a second group, and controlling the memory blocks included the first group and the second group, respectively,
   wherein the controller is further suitable for:
   managing all operations except for an erase operation to the memory blocks of the first group through a first operation task;
   managing all operations except for an erase operation to the memory blocks of the second group through a second operation task; and
   managing the erase operation to the memory blocks of the first group and the memory blocks of the second group through an erase operation task.

2. The memory system of claim 1, wherein the controller is suitable for, when there is need to perform an erase operation to a first memory block among the memory blocks of the first group as a result of a first predetermined operation through the first operation task, providing information of the first memory block into a first erase operation list managed by the erase operation task and performing an erase operation to memory blocks included in the first erase operation list through the erase operation task when a first predetermined condition is satisfied.

3. The memory system of claim 2, wherein the controller is suitable for performing an erase operation to a first portion of memory block selected among the memory blocks included in the first erase operation list through the erase operation task by determining that the first predetermined condition is satisfied when a ratio of memory blocks in a free status to memory blocks in a "being used" status among the memory blocks of the first group is below a first predetermined threshold ratio, or when a number of memory blocks in the free status is below a first predetermined threshold number.

4. The memory system of claim 3, wherein the controller is suitable for controlling a number of memory blocks selected as the first portion of memory blocks among the memory blocks included in the first erase operation list according to a ratio of a number of memory blocks included in the first erase operation list to a number of memory blocks in the free status among the memory blocks of the first group.

5. The memory system of claim 2, wherein the controller is suitable for, when there is need to perform an erase operation to a second memory block among the memory blocks of the second group as a result of a second predetermined operation through the second operation task, including information of the second memory block into a second erase operation list managed by the erase operation task and performing an erase operation to memory blocks included in the second erase operation list through the erase operation task when a second predetermined condition is satisfied.

6. The memory system of claim 5, wherein the controller is suitable for performing an erase operation to a second portion of memory block selected among the memory blocks included in the second erase operation list through the erase operation task by determining the second predetermined condition as satisfied when a ratio of memory blocks in a free status to memory blocks in a "being used" status among the memory blocks of the second group is below a second predetermined threshold ratio, or when a number of memory blocks in the free status is below a second predetermined threshold number.

7. The memory system of claim 6, wherein the controller is suitable for controlling a number of memory blocks selected as the second portion of memory blocks among the memory blocks included in the second erase operation list according to a ratio of a number of memory blocks included in the second erase operation list to a number of memory blocks in the free status among the memory blocks of the second group.

8. The memory system of claim 5, wherein the controller is suitable for, when a foreground operation is requested among all operations except for an erase operation managed through the first or second operation task during an erase operation to memory blocks included in the first or second erase operation list through the erase operation task, suspending the erase operation to memory blocks included in the first or second erase operation list through the erase operation task, performing the requested foreground operation through the first or second operation task, and then resuming the suspended erase operation to memory blocks included in the first or second erase operation list through the erase operation task.

9. The memory system of claim 8, wherein the controller is suitable for setting a higher priority to an erase operation to the memory blocks included in the first or second erase operation list managed through the erase operation task than a background operation among all operations except for an erase operation managed through the first or second operation task.

10. The memory system of claim 5,
wherein the controller is suitable for:
checking whether the first predetermined condition is satisfied whenever all operations except for an erase operation managed by the first operation task is performed N times; and
checking whether the second predetermined condition is satisfied whenever all operations except for an erase operation managed by the second operation task is performed M times, and
wherein each of N and M is a natural number greater than 1.

11. An operating method for a memory system including a nonvolatile memory device having a plurality of memory blocks, the method comprising:
a first step of controlling memory blocks included in a first group among the plurality of memory blocks; and
a second step of controlling memory blocks included in a second group among the plurality of memory blocks,
wherein the first step includes managing all operations except for an erase operation to the memory blocks of the first group through a first operation task, and managing the erase operation to the memory blocks of the first group through an erase operation task,
wherein the second step includes managing all operations except for an erase operation to the memory blocks of the second group through a second operation task, and managing the erase operation to the memory blocks of the second group through the erase operation task.

12. The method of claim 11, wherein the first step includes, when there is need to perform an erase operation to a first memory block among the memory blocks of the first group as a result of a first predetermined operation through the first operation task, providing information of the first memory block into a first erase operation list managed by the erase operation task and performing an erase operation to memory blocks included in the first erase operation list through the erase operation task when a first predetermined condition is satisfied.

13. The method of claim 12, wherein the first step includes performing an erase operation to a first portion of memory block selected among the memory blocks included in the first erase operation list through the erase operation task by determining that the first predetermined condition is satisfied when a ratio of memory blocks in a free status to memory blocks in a "being used" status among the memory blocks of the first group is below a first predetermined threshold ratio, or when a number of memory blocks in the free status is below a first predetermined threshold number.

14. The method of claim 13, wherein the first step includes controlling a number of memory blocks selected as the first portion of memory blocks among the memory blocks included in the first erase operation list according to a ratio of a number of memory blocks included in the first erase operation list to a number of memory blocks in the free status among the memory blocks of the first group.

15. The method of claim 12, wherein the second step includes, when there is need to perform an erase operation to a second memory block among the memory blocks of the second group as a result of a second predetermined operation through the second operation task, including information of the second memory block into a second erase operation list managed by the erase operation task and performing an erase operation to memory blocks included in the second erase operation list through the erase operation task when a second predetermined condition is satisfied.

16. The method of claim 15, wherein the second step includes performing an erase operation to a second portion of a memory block selected among the memory blocks included in the second erase operation list through the erase operation task by determining that the second predetermined condition is satisfied when a ratio of memory blocks in a free status to memory blocks in a "being used" status among the memory blocks of the second group is below a second predetermined threshold ratio, or when a number of memory blocks in the free status is below a second predetermined threshold number.

17. The method of claim 16, wherein the second step includes controlling a number of memory blocks selected as the second portion of memory blocks among the memory blocks included in the second erase operation list according to a ratio of a number of memory blocks included in the second erase operation list to a number of memory blocks in the free status among the memory blocks of the second group.

18. The method of claim 15,
wherein the first step includes, when a foreground operation is requested among all operations except for an erase operation managed through the first operation task during an erase operation to memory blocks included in the first erase operation list through the erase operation task, suspending the erase operation to memory blocks included in the first erase operation list through the erase operation task, performing the requested foreground operation through the first operation task, and then resuming the suspended erase operation to memory blocks included in the first erase operation list through the erase operation task, and
wherein the second step includes, when a foreground operation is requested among all operations except for an erase operation managed through the second operation task during an erase operation to memory blocks included in the second erase operation list through the erase operation task, suspending the erase operation to memory blocks included in the second erase operation list through the erase operation task, performing the requested foreground operation through the second operation task, and then resuming the suspended erase operation to memory blocks included in the second erase operation list through the erase operation task.

19. The method of claim 18,
wherein the first step includes setting a higher priority to an erase operation to the memory blocks included in the first erase operation list managed through the erase operation task than a background operation among all operations except for an erase operation managed through the first operation task, and
wherein the second step includes setting a higher priority to an erase operation to the memory blocks included in the second erase operation list managed through the erase operation task than a background operation among all operations except for an erase operation managed through the second operation task.

20. The method of claim 15,
wherein the first step includes checking whether the first predetermined condition is satisfied whenever all operations except for an erase operation managed by the first operation task is performed N times,
wherein the second step includes checking whether the second predetermined condition is satisfied whenever all operations except for an erase operation managed by the second operation task is performed M times, and
wherein each of N and M is a natural number greater than 1.

* * * * *